(12) United States Patent
Dai et al.

(10) Patent No.: US 6,824,613 B2
(45) Date of Patent: Nov. 30, 2004

(54) SUBSTRATE PROCESSING APPARATUS

(75) Inventors: Naoki Dai, Tokyo (JP); Masaya Seki, Tokyo (JP); Akihiro Yazawa, Tokyo (JP); Toshio Yokoyama, Tokyo (JP); Akira Owatari, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/156,791

(22) Filed: May 30, 2002

(65) Prior Publication Data

US 2003/0221612 A1 Dec. 4, 2003

(51) Int. Cl.$^7$ .............................................. B05C 11/02
(52) U.S. Cl. ......................... 118/72; 118/52; 118/320; 118/326; 118/73; 427/299; 427/240; 427/425; 414/222.04; 414/937; 414/941; 134/33; 134/902
(58) Field of Search ....................... 204/224 R, 297.01, 204/269, 198; 427/426, 424, 299, 355, 368, 240, 425, 444, 304; 118/72, 73, 58, 66, 500, 52, 320, 412, 423; 414/222.04–222.07, 222.09, 226.01, 937, 941; 134/33, 62, 902

(56) References Cited

U.S. PATENT DOCUMENTS 5,375,291 A * 12/1994 Tateyama et al. ............ 15/302
5,935,330 A * 8/1999 Taniguchi ..................... 118/66
6,265,020 B1 * 7/2001 Allardyce et al. ............ 427/96
6,517,130 B1 * 2/2003 Donoso et al. ............ 294/64.1
6,578,891 B1 * 6/2003 Suzuki et al. .............. 294/64.1
6,582,580 B1 * 6/2003 Hongo et al. ................ 205/118

FOREIGN PATENT DOCUMENTS

| JP | 2001-77175 | * 3/2001 | ........... H01L/21/68 |
| WO | WO99/45170 | * 10/1999 | ........... C23C/18/31 |

* cited by examiner

*Primary Examiner*—Chris Fiorilla
*Assistant Examiner*—Michelle Acevedo Lazor
(74) *Attorney, Agent, or Firm*—Wenderoth, Lind & Ponack, L.L.P.

(57) ABSTRACT

A substrate processing apparatus can efficiently form, e.g. by electroless plating, an interconnects-protective layer on the surface of a substrate at a low initial cost for the apparatus and a low running cost without the need for a wide installation space. The substrate processing apparatus includes a loading/unloading and cleaning area accommodating a first transfer robot which has a hand adapted for handling a dry substrate and a hand adapted for handling a wet substrate, a loading port which loads a substrate cassette that houses a substrate, and a cleaning unit for cleaning a substrate. A plating treatment area accommodates a second transfer robot which has a back surface-attracting type of hand provided with a reversing mechanism, a pretreatment unit for carrying out pretreatment of a substrate before plating, and a plating treatment unit for carrying out plating treatment of the substrate.

11 Claims, 20 Drawing Sheets

SUBSTRATE PROCESSING APPARATUS

BACKGROUND OF THE INVENTION

1. Field of the Invention

This invention relates to a substrate processing apparatus, and more particularly to a substrate processing apparatus useful for forming, for example by electroless plating, an interconnects-protective layer on the exposed surface of embedded interconnects which have been formed by embedding an electric conductor, such as copper, silver or gold, in fine recesses for interconnects formed in the surface of a substrate, especially a semiconductor wafer.

2. Description of the Related Art

As a process for forming interconnects in a semiconductor device, the so-called "damascene process", which comprises embedding a metal (electric conductor) into trenches for interconnects and contact holes, is coming into practical use. According to this process, aluminum, or more recently a metal such as silver or copper, is embedded into trenches for interconnects and contact holes previously formed in the interlevel dielectric of a semiconductor substrate. Thereafter, an extra metal is removed by chemical mechanical polishing (CMP) so as to flatten the surface of the substrate.

In the case of interconnects formed by such a process, for example copper interconnects formed by using copper as an interconnect material, the embedded copper interconnects have an exposed surface after the flattening processing. In order to prevent thermal diffusion of such interconnects (copper), or to prevent oxidation of such interconnects (copper) e.g. in forming thereon an insulating film (oxide film) under an oxidizing atmosphere to produce a semiconductor device having a multi-layer interconnect structure, it is now under study to selectively cover the exposed surface of interconnects with an interconnects-protective layer (cap material) composed of a Co alloy, a Ni alloy or the like so as to prevent thermal diffusion and oxidation of the interconnects. Such an interconnects-protective layer of a Co alloy, a Ni alloy or the like can be produced e.g. by electroless plating.

As shown in FIG. 20, fine recesses 4 are formed in an insulating film 2 of $SiO_2$ or the like which has been deposited on the surface of a substrate W such as a semiconductor wafer. A barrier layer 6 of TaN or the like is formed on the entire surface, and then copper plating, for example, is carried out onto the surface of the substrate W to fill the fine recesses 4 with copper and deposit a copper film on the insulating film. Thereafter, CMP (chemical mechanical polishing) is carried out onto the surface of the substrate W so as to flatten the surface, thereby forming interconnects 8 composed of a copper film in the insulating film 2. Thereafter, an interconnects-protective layer (cap material) 9 composed of a Co—W—P alloy film is formed e.g. by electroless plating selectively on the surface of the interconnects (copper film) 8 to protect the interconnects 8.

A common electroless plating method for the selective formation of the interconnects-protective layer (cap material) 9 of Co—W—P alloy film on the surface of interconnects 8 generally involves the following process steps: First, the substrate W such as a semiconductor wafer, which has undergone the CMP treatment, is immersed in an acid solution e.g. of 0.5M $H_2SO_4$ at a solution temperature of e.g. 25° C. for e.g. one minute to remove CMP residues, such as copper, remaining on the surface of the insulating film 2. After cleaning the surface of the substrate W with a cleaning liquid such as ultrapure water, the substrate W is immersed in a mixed solution, e.g. of 0.005 g/L $PdCl_2$ and 0.2 ml/L HCl, at the solution temperature of e.g. 25° C. for e.g. one minute to adhere Pd as a catalyst to the surface of interconnects 8, thereby activating the exposed surface of interconnects 8. Next, after cleaning the surface of the substrate W with a cleaning liquid such as ultrapure water, the substrate W is immersed in a solution containing e.g. 20 g/L of $Na_3C_6H_5O_7.2H_2O$ (sodium citrate) at the solution temperature of e.g. 25° C., thereby carrying out neutralization treatment of the surface of interconnects 8. Thereafter, after washing the surface of the substrate W with ultrapure water, the substrate W is immersed in a Co—W—P plating solution at a solution temperature of e.g. 80° C. for e.g. 120 seconds, thereby carrying out selective electroless plating (electroless Co—W—P cap plating) onto the activated surface of interconnects 8. Thereafter, the surface of the substrate W is cleaned with a cleaning liquid such as ultrapure water. The interconnects-protective layer 9 composed of a Co—W—P alloy film is thus formed selectively on the surface of interconnects 8 to protect the interconnects 8.

When forming such an interconnects-protective layer (cap material) composed of a Co—W—P alloy film by electroless plating, as described above, a catalyst-imparting treatment for imparting a catalyst, such as Pd, to the surface of interconnects is carried out. Further, in order to prevent an interconnects-protective layer from being formed on an insulating film, it is necessary to remove CMP residues, such as copper, remaining on the surface of the insulating film. Removal of such residues is generally practiced by using an inorganic acid such as $H_2SO_4$ or HCl. On the other hand, an alkaline solution is generally used as an electroless plating solution. Accordingly, it is necessary to provide a neutralization step immediately before an electroless plating treatment to stabilize the plating process. A number of pretreatment steps, before an electroless plating step, are thus necessary, and a number of treatment baths for carrying out the steps are needed. This will lead to a low throughput and a complicated process control for the respective steps. Moreover, the total facilities should necessarily be large and a wide installation space in a clean room will be required, leading to a high cost for clean room.

SUMMARY OF THE INVENTION

The present invention has been made in view of the above situation in the related art. It is therefore an object of the present invention to provide a substrate processing apparatus which can efficiently form an interconnects-protective layer, for example, on the surface of a substrate at a low initial cost for apparatus and a low running cost without the need for a wide installation space.

In order to achieve the above object, the present invention provides a substrate processing apparatus comprising a loading/unloading and cleaning area accommodating a first transfer robot which has a hand adapted for handling of a dry substrate and a hand adapted for handling of a wet substrate, a loading port which loads a substrate cassette that houses a substrate, and a cleaning unit for cleaning a substrate. A plating treatment area accommodating a second transfer robot which has a back surface-attracting type of hand provided with a reversing mechanism, a pretreatment unit for carrying out a pretreatment of a substrate before plating, and a plating treatment unit for carrying out a plating treatment of the substrate.

By thus dividing the interior of the apparatus into two areas, i.e. the loading/unloading and cleaning area and the plating treatment area, and providing the areas with the first and second transfer robots, respectively, each having a hand or hands meeting the process requirements of the respective area, the process steps for the formation of an interconnects-protective film e.g. by electroless plating can be carried out consecutively in one apparatus. Accordingly, as compared to the case of carrying out the respective process steps in separate apparatuses, the total facilities can be made compact and a wide installation space is not needed. Further, the initial cost for the apparatus and the running cost can be reduced. In addition, an interconnects-protective film can be formed in a short time.

In the substrate processing apparatus, the pressures in the two areas can be set as follows: pressure in the loading/unloading and cleaning area> pressure in the plating treatment area. Further, the pressure in the loading/unloading and cleaning area can be set to be lower than the pressure in a clean room. This can prevent air in the plating treatment area from flowing into the loading/unloading and cleaning area, and can also prevent air in the loading/unloading and cleaning area from flowing into the clean room.

A temporary storage stage may be provided in the loading/unloading and cleaning area. In this case, the first transfer robot can transfer a substrate between the substrate cassette, the cleaning unit and the temporary storage stage.

A roll brush cleaning unit and a spin-drying unit, for example, may be provided as the cleaning unit in the loading/unloading and cleaning area. This makes it possible to subject a substrate, which has undergone a treatment such as electroless plating, to a two-step cleaning in a consecutive manner and spin-dry the substrate.

The second transfer robot can transfer a substrate between the temporary storage stage, the pretreatment unit and the plating treatment unit. The provision of the reversing mechanism in the hand of the second transfer robot eliminates the need for separately providing an independent reversing mechanism and thus can simplify the apparatus.

A pre-cleaning unit for carrying out pre-cleaning of a substrate, a first pretreatment unit for imparting a catalyst to the surface of the substrate and a second pretreatment unit for carrying out a chemical liquid treatment of the catalyst-imparted surface of the substrate, for example, may be provided as the pretreatment unit in the plating treatment area.

The plating treatment area may also be provided with an inter-plating cleaning unit as the pretreatment unit for carrying out cleaning of a substrate in the waiting time between plating treatments.

DETAILED DESCRIPTION OF THE PREFERRED EMBODIMENTS

Preferred embodiments of the present invention will now be described. The below-described embodiments relate to application to an electroless plating apparatus, in particular, which can efficiently form, by electroless plating, an interconnects-protective layer on the surface of interconnects formed in a substrate. The present invention, however, can of course be applicable to other substrate processing apparatuses, such as an electroplating apparatus, a CVD apparatus, etc.

Figure 1:
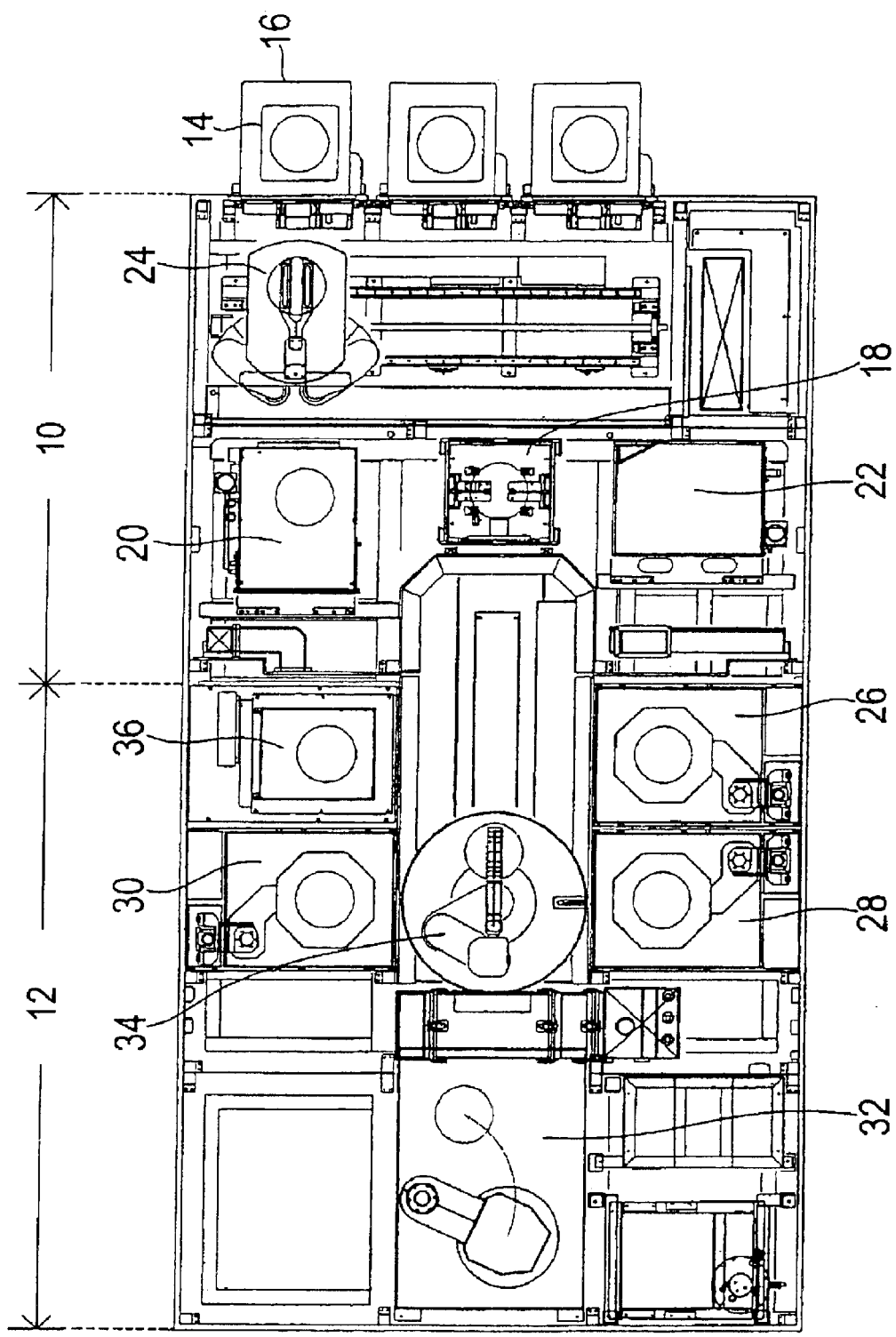
FIG. 1 is a plan view showing the layout of a substrate processing apparatus (electroless plating apparatus) according to an embodiment of the present invention.

FIG. 1 is a plan view showing the layout of a substrate processing apparatus (electroless plating apparatus) according to an embodiment of the present invention. As shown in FIG. 1, the substrate processing apparatus is divided into two areas: a loading/unloading and cleaning area 10, and a plating treatment area 12. The substrate processing apparatus (electroless plating apparatus) is installed in a clean room, and the pressures in the two areas are set as follows: pressure in loading/unloading and cleaning area 10> pressure in plating treatment area 12.

Further, the pressure in the loading/unloading and cleaning area 10 is set to be lower than the pressure in the clean room. This prevents air flowing from the plating treatment area 12 into the loading/unloading and cleaning area 10, and also prevents air flowing from the loading/unloading and cleaning area 10 into the clean room.

In the loading/unloading and cleaning area 10, there are provided three loading ports 16 each for placing thereon and housing a substrate cassette 14 that houses substrates W (see FIG. 20) each having the interconnects 8 formed in the recesses 4 provided in the surface, a temporary storage stage 18, a roll brush cleaning unit 20 as a cleaning unit, a spin-drying unit 22 as a cleaning unit, and a movable first transfer robot 24 for transferring the substrate W between them.

In the plating treatment area 12, there are provided a pre-cleaning unit 26 as a pretreatment unit, a first pretreatment unit 28, a second pretreatment unit 30, an electroless plating treatment unit 32, and a second transfer robot 34 for transferring the substrate between them, and also between them and the temporary storage stage 18. Further according to this embodiment, an inter-plating cleaning unit 36 is provided for carrying out cleaning (anti-drying) of the substrate W in the waiting time between plating treatments.

Figure 20:
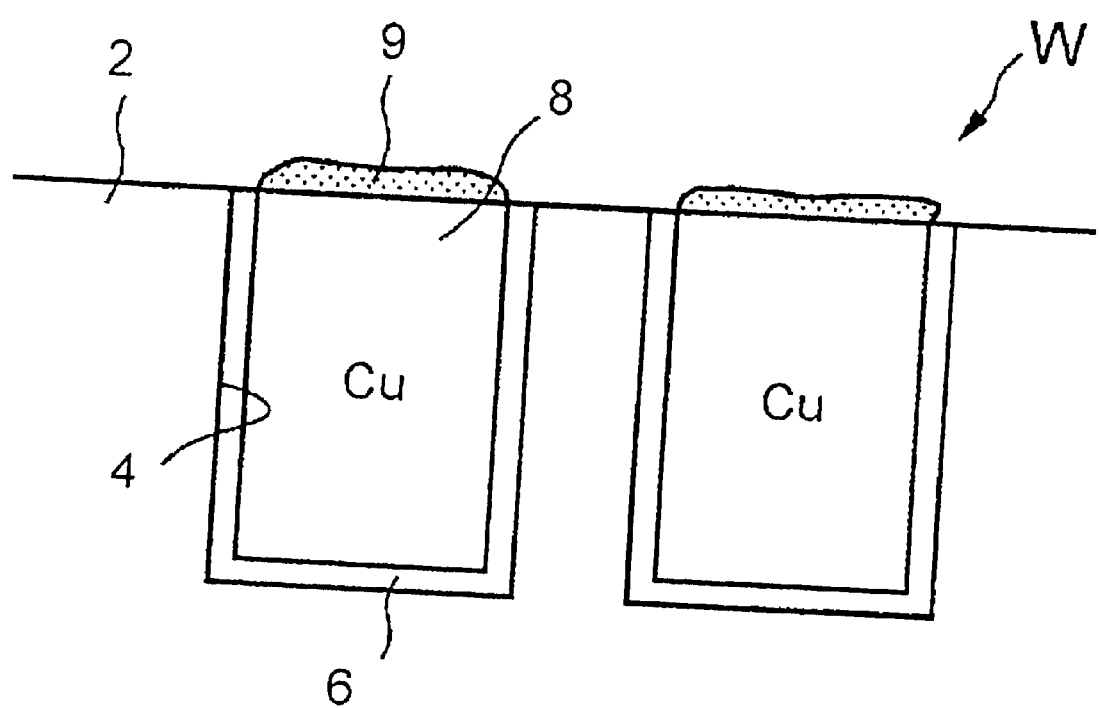
FIG. 20 is a sectional view illustrating an interconnects-protective layer formed by electroless plating.

A description will now be given of an example of a series of electroless plating treatments by the electroless plating apparatus. According to this example, as shown in FIG. 20, an interconnects-protective layer (cap material) 9 composed of a Co—W—P alloy film is selectively formed to protect the interconnects 8.

First, a substrate W is taken by the first transfer robot 24 out of the substrate cassette 14 which houses the substrates W, each having the interconnects 8 formed in the surface (see FIG. 20), with its front surface upward (face up) and which is loaded in the loading/unloading and cleaning area 10, and the substrate W is placed on the temporary storage stage 18. The substrate W placed on the temporary storage stage 18 is then transferred by the second transfer robot 34 to the pre-cleaning unit 26. During the transference, the substrate W is reversed so that the front surface of the substrate W faces downward (face down).

In the pre-cleaning unit 26, the substrate W is held with its front surface downward, and pre-cleaning of the front surface is carried out. For example, the substrate W is immersed in an acid solution, e.g. a 0.5 mol $H_2SO_4$ solution, at a solution temperature of e.g. 25° C. for e.g. one minute, thereby removing CMP residues, such as copper, remaining on the surface of the insulating film 2 (see FIG. 20). Thereafter, the front surface of the substrate W is cleaned with a cleaning liquid such as ultrapure water.

Next, the substrate W after the pre-cleaning is transferred by the second transfer robot 34 to the first pretreatment unit 28, where the substrate W is held with its front surface downward, and a catalyst-imparting treatment is carried out onto the front surface. For example, the substrate W is immersed in a mixed solution e.g. of 0.005 g/L of $PdCl_2$ and 0.2 ml/L of HCl at a solution temperature of e.g. 25° C. for e.g. one minute, thereby adhering Pd as a catalyst to the surface of interconnects 8, i.e. forming Pd nuclei as catalyst nuclei (seed) on the surface of interconnects 8 so as to activate the exposed surface of interconnects 8. Thereafter, the surface of the substrate W is cleaned with a cleaning liquid such as ultrapure water.

The catalyst-imparted substrate W is transferred by the second transfer robot 34 to the second pretreatment unit 30, where the substrate W is held with its front surface downward, and a chemical liquid treatment is carried out onto the front surface. For example, the substrate W is immersed in a solution containing e.g. 20 g/L of $Na_3C_6H_5O_7.2H_2O$ (sodium citrate) at a solution temperature of e.g. 25° C., thereby carrying out neutralization treatment of the surface of interconnects 8. Thereafter, the surface of the substrate W is washed e.g. with ultrapure water.

The substrate W, having undergone the above pretreatments before electroless plating, is transferred by the second transfer robot 34 to the electroless plating treatment unit 32, where the substrate W is held with its front surface downward, and an electroless plating treatment is carried out onto the front surface. For example, the substrate W is immersed in a Co—W—P plating solution at a solution temperature of e.g. 80° C. for e.g. 120 seconds, thereby carrying out selective electroless plating (electroless Co—W—P cap plating) onto the activated surface of interconnects 8. Thereafter, the surface of the substrate W is cleaned with a cleaning liquid such as ultrapure water. The interconnects-protective layer 9 composed of a Co—W—P alloy film (see FIG. 20, and so forth) is thus formed selectively on the surface of interconnects 8 to protect the interconnects 8.

Next, the substrate W after the electroless plating treatment is, according to necessity, transferred by the second transfer robot 34 to the inter-plating cleaning unit 36, where the substrate W is washed with pure water to prevent drying of the substrate W. The substrate W is then transferred by the second transfer robot 34 to the temporary storage stage 18. During the transference, the substrate W is reversed so that the front surface faces upward (face up).

The substrate W placed on the temporary storage stage 18 is transferred by the first transfer robot 24 to the roll brush cleaning unit 20, where particles and unnecessary substances adhering to the surface of the substrate W are removed by a roll-shaped brush. Thereafter, the substrate W is transferred by the first transfer robot 24 to the spin-drying unit 22, where chemical cleaning and pure water cleaning of the surface of the substrate W are carried out, followed by spin-drying. The substrate W after the spin-drying is returned by the first transfer robot 24 to the substrate cassette 14 loaded in the loading/unloading and cleaning area 10.

In the case of the embodiment, a Co—W—B alloy film is used as an interconnects-protective layer 9. Specifically, the interconnects-protective layer 9 composed of the Co—W—B alloy film is formed by using a plating solution containing cobalt ions, a complexing agent, a pH buffer, a pH adjusting agent, an alkylamine borane as a reducing agent, and a compound containing tungsten, and dipping the surface of the substrate W in the plating solution.

If desired, the plating solution may further contain at least one of a stabilizer selected from one or more kinds of heavy metal compounds and sulfur compounds, and surfactant. Further, the plating solution is adjusted within a pH range of preferably 5–14, more preferably 6–10, by using a pH adjusting agent such as ammonia water or quaternary ammonium hydroxide. The temperature of the plating solution is generally in the range of 30–90° C., preferably 40–80° C.

The cobalt ions contained in the plating solution may be supplied from a cobalt salt, for example, cobalt sulfate, cobalt chloride or cobalt acetate. The amount of the cobalt ions is generally in the range of 0.001–1.0 mol/L, preferably 0.01–0.3 mol/L.

Specific examples of the complexing agent may include carboxylic acids, such as acetic acid, and their salts; oxycarboxylic acids, such as tartaric acid and citric acid, and their salts; and aminocarboxylic acids, such as glycine, and their salts. These compounds may be used either singly or as a mixture of two or more. The total amount of the complexing agent is generally 0.001–1.5 mol/L, preferably 0.01–1.0 mol/L. Regarding the pH buffer, ammonium sulfate, ammonium chloride and boric acid may be mentioned as specific examples. The pH buffer can be used generally in an amount of 0.01–1.5 mol/L, preferably 0.1–1.0 mol/L.

Regarding the pH adjusting agent, ammonia water and tetramethylammonium hydroxide (TMAH) may be mentioned as specific examples. By using the pH adjusting agent, the pH of the plating solution is adjusted generally within the range of 5–14, preferably 6–10. An alkylamine borane as the reducing agent, dimethylamine borane (DMAB) and diethylamine borane, may be mentioned. The reducing agent is used generally in an amount of 0.01–1.0 mol/L, preferably 0.01–0.5 mol/L.

Examples of the compound containing tungsten may include tangstic acids and their salts; and heteropoly acids, such as tangstophosphoric acid (e.g. $H_3(PW_{12}P_{40}) \cdot nH_2O$), and their salts. The compound containing tungsten is used generally in an amount of 0.001–1.0 mol/L, preferably 0.01–0.1 mol/L.

Besides above described compounds, other known additives may be added to the plating solution. Examples of usable additive include a bath stabilizer, which may be a heavy metal compound such as a lead compound, a sulfur compound such as a thiocyanate, or a mixture thereof, and a surfactant of an anionic, cationic or nonionic type.

In the case of the embodiment, a Co—W—B alloy is used as an interconnects-protective layer 9. An interconnects-protective layer composed of Co—B, Ni—B or Ni—W—B alloy may also be used as an interconnects-protective layer 9. Further, though the case of using copper as an interconnect material has been described, it is also possible to use a copper alloy, silver, a silver alloy, gold or a gold alloy etc. other than copper.

An explanation will be given below of the details of the devices, such as the transfer robots and the various units, provided in the electroless plating apparatus of FIG. 1. The transfer robots 24 and 34 respectively provided in the areas 10 and 12 can transfer the substrate W with its front surface upward or downward according to process requirements and, in addition, the transfer robot 34 has a hand which is provided with a reversing mechanism. This makes it possible to carry out the process steps for forming an interconnects-protective layer by electroless plating consecutively in one apparatus.

Figure 2:
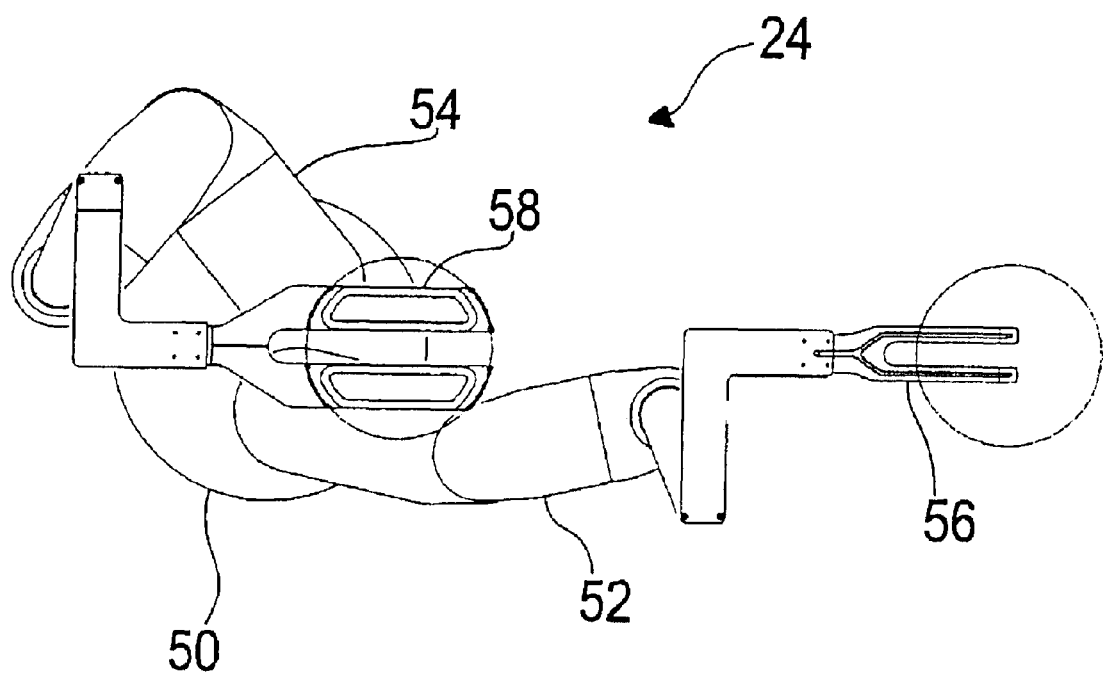
FIG. 2 is a plan view of a first transfer robot.
Figure 3:
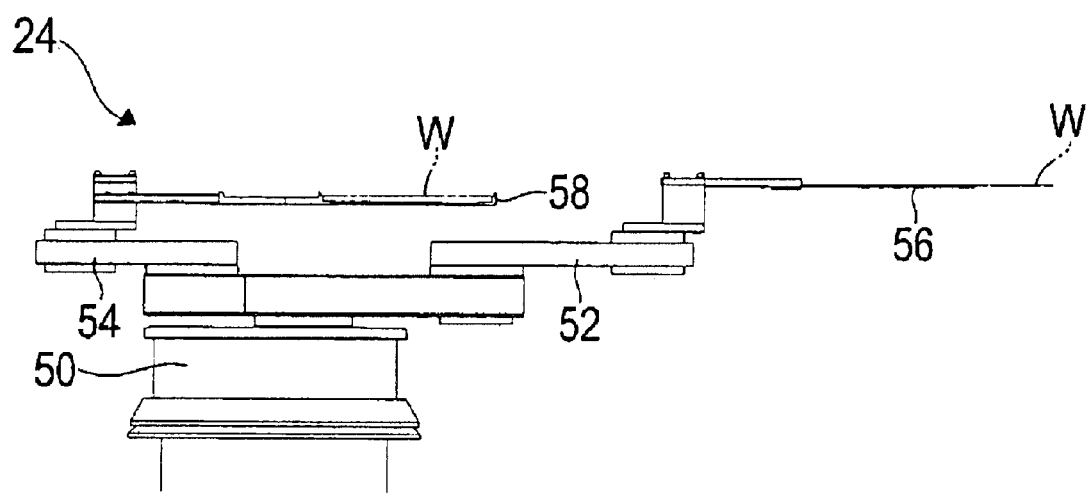
FIG. 3 is a front view of the first transfer robot.
Figure 4:
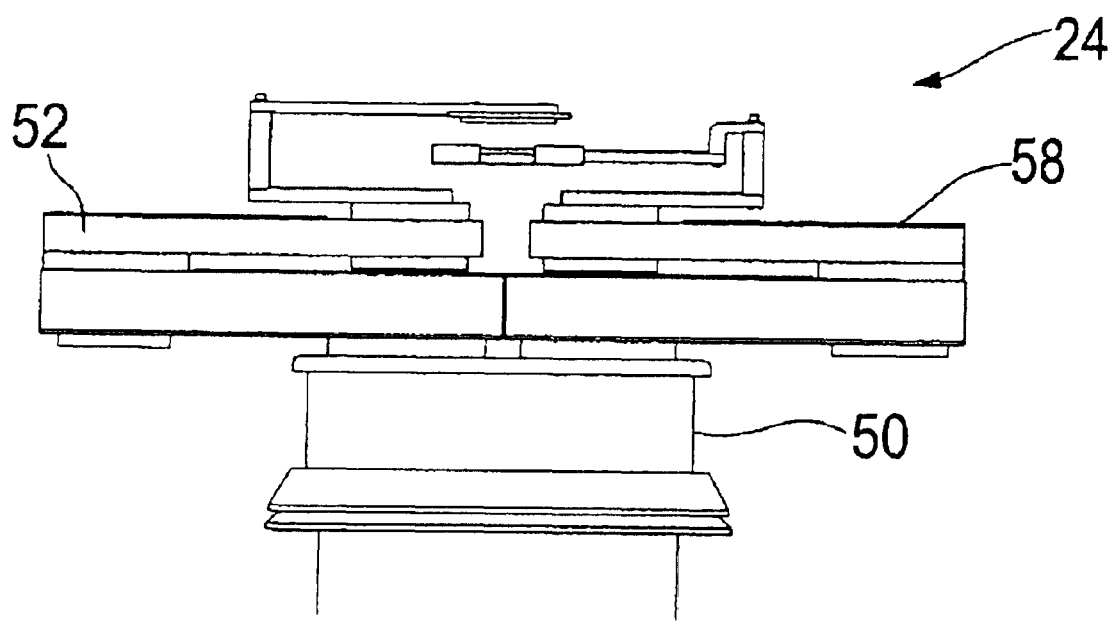
FIG. 4 is a side view of the first transfer robot.

FIGS. 2 through 4 show the first transfer robot 24 provided in the loading/unloading and cleaning area 10. The first transfer robot 24 has a pair of extensible robot arms 52, 54 disposed above a robot body 50, and robot hands 56, 58 respectively mounted on the ends of the robot arms 52, 54. A thin, substrate-attracting type of hand adapted for handling of a dry substrate (dry hand) is used as one robot hand 56, and a thick, substrate-drop-in type of hand adapted for handling of a wet substrate (wet hand) is used as the other robot hand 58.

Both such hand 56 for dry substrate and hand 58 for wet substrate are employed in the first transfer robot 24, because the transfer robot 24, as described above, transfers the substrate W between the substrate cassette 14, the temporary storage stage 18, the roll brush cleaning unit 20 and the spin-drying unit 22. During the transference, the substrate W can be both in a dry state and in a wet state. In particular, the substrate W is in a completely dried state during its transference from the substrate cassette 14 to the temporary storage stage 18 and during its transference from the spin-drying unit 22 to the substrate cassette 14, and therefore the hand 56 for dry substrate is employed. On the other hand, since the substrate is in a wet state during its transference from the temporary storage stage 18 to the roll brush cleaning unit 20 and to the spin-drying unit 22, the hand 58 for wet substrate is employed.

Figure 5:
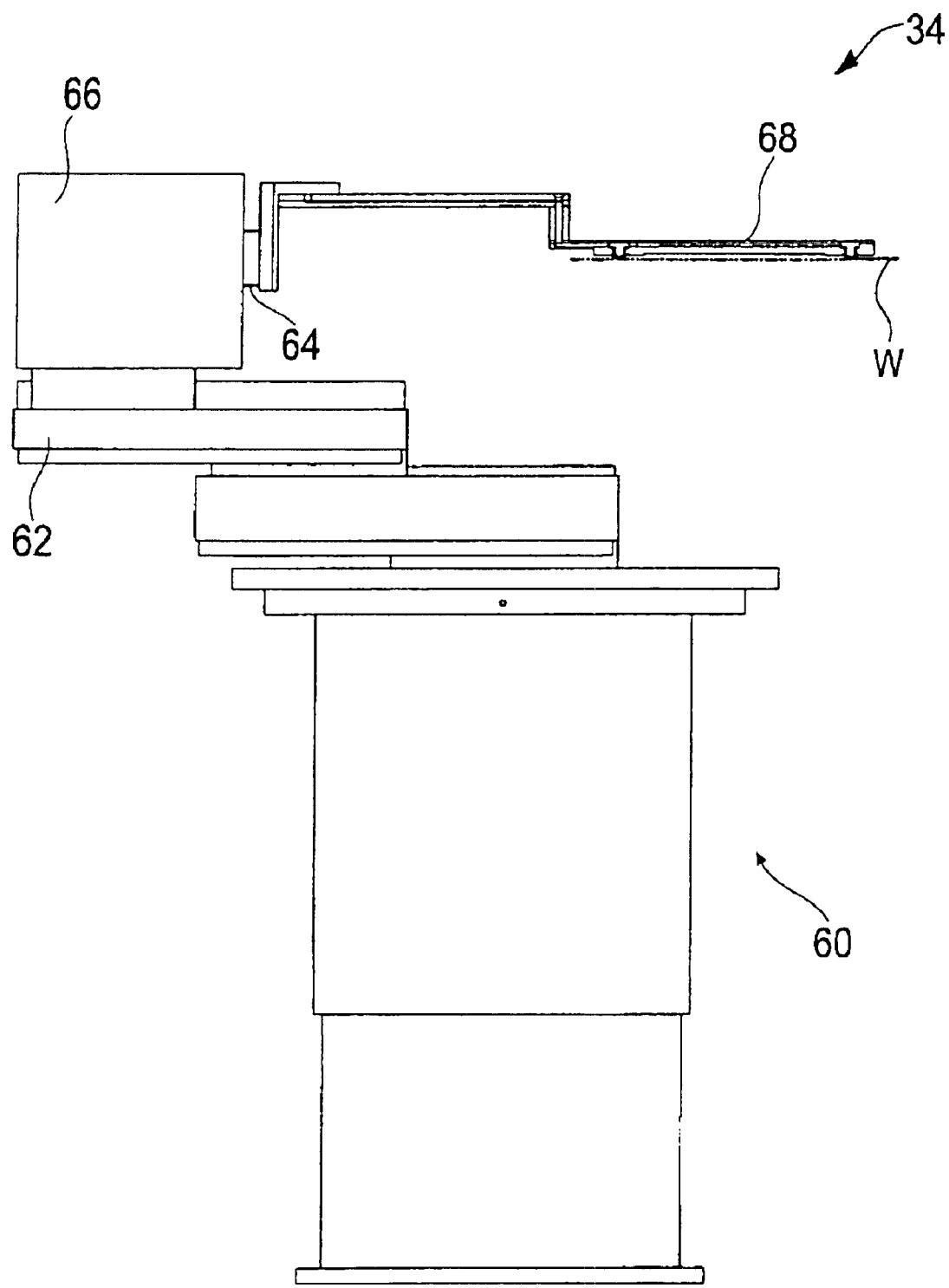
FIG. 5 is a front view of a second transfer robot.
Figure 6:
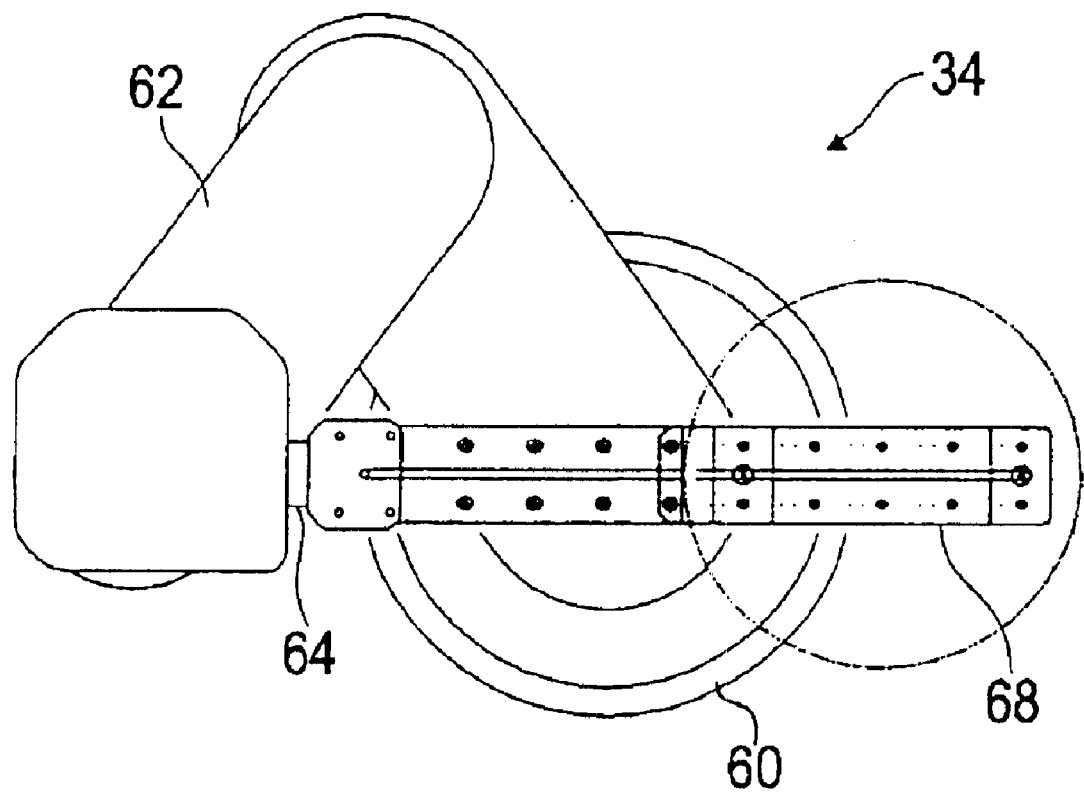
FIG. 6 is a plan view of the second transfer robot.
Figure 7:
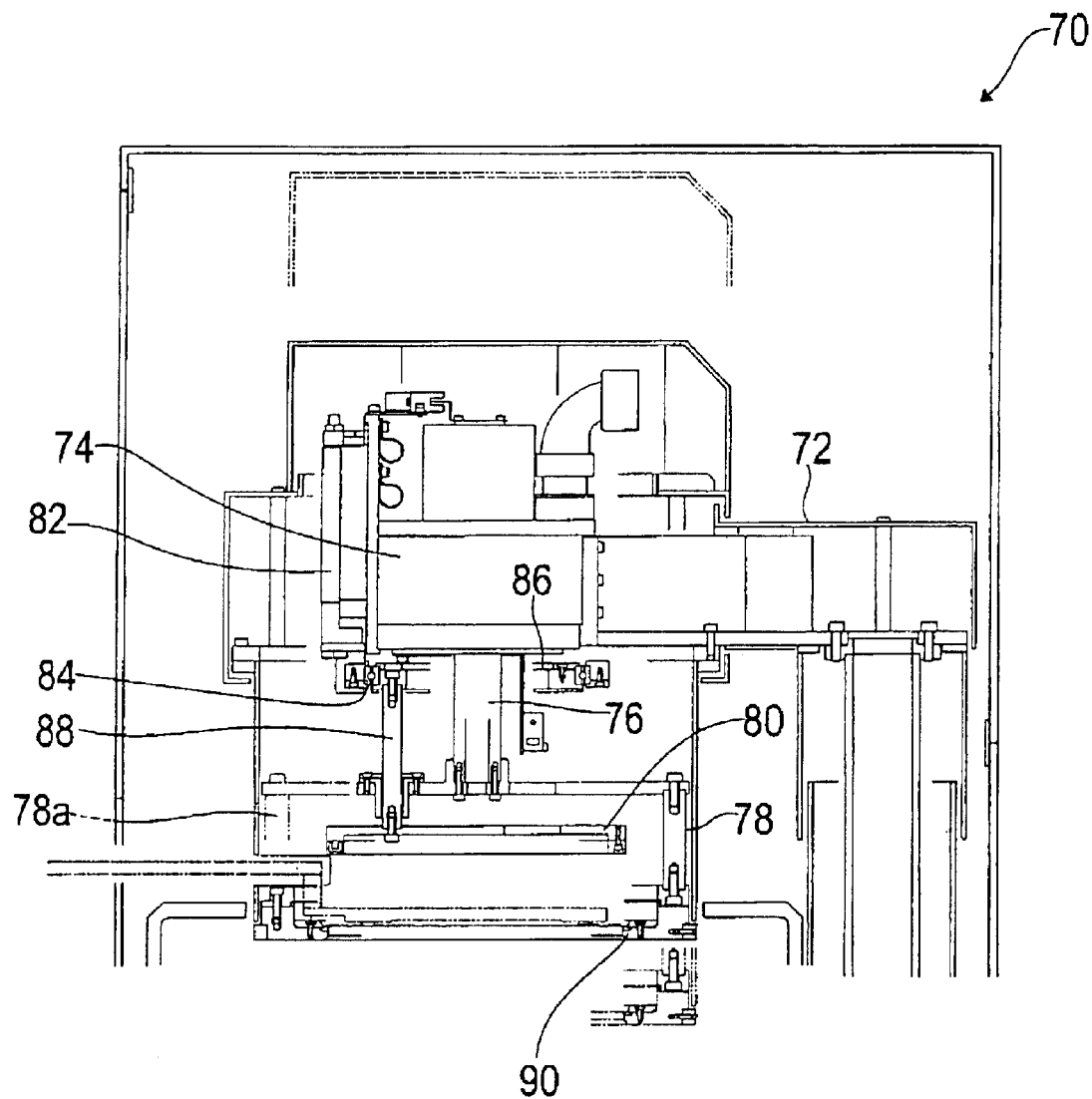
FIG. 7 is a longitudinal sectional front view showing the upper portion of a treatment unit usable as a pre-cleaning unit or as a pretreatment unit.
Figure 8:
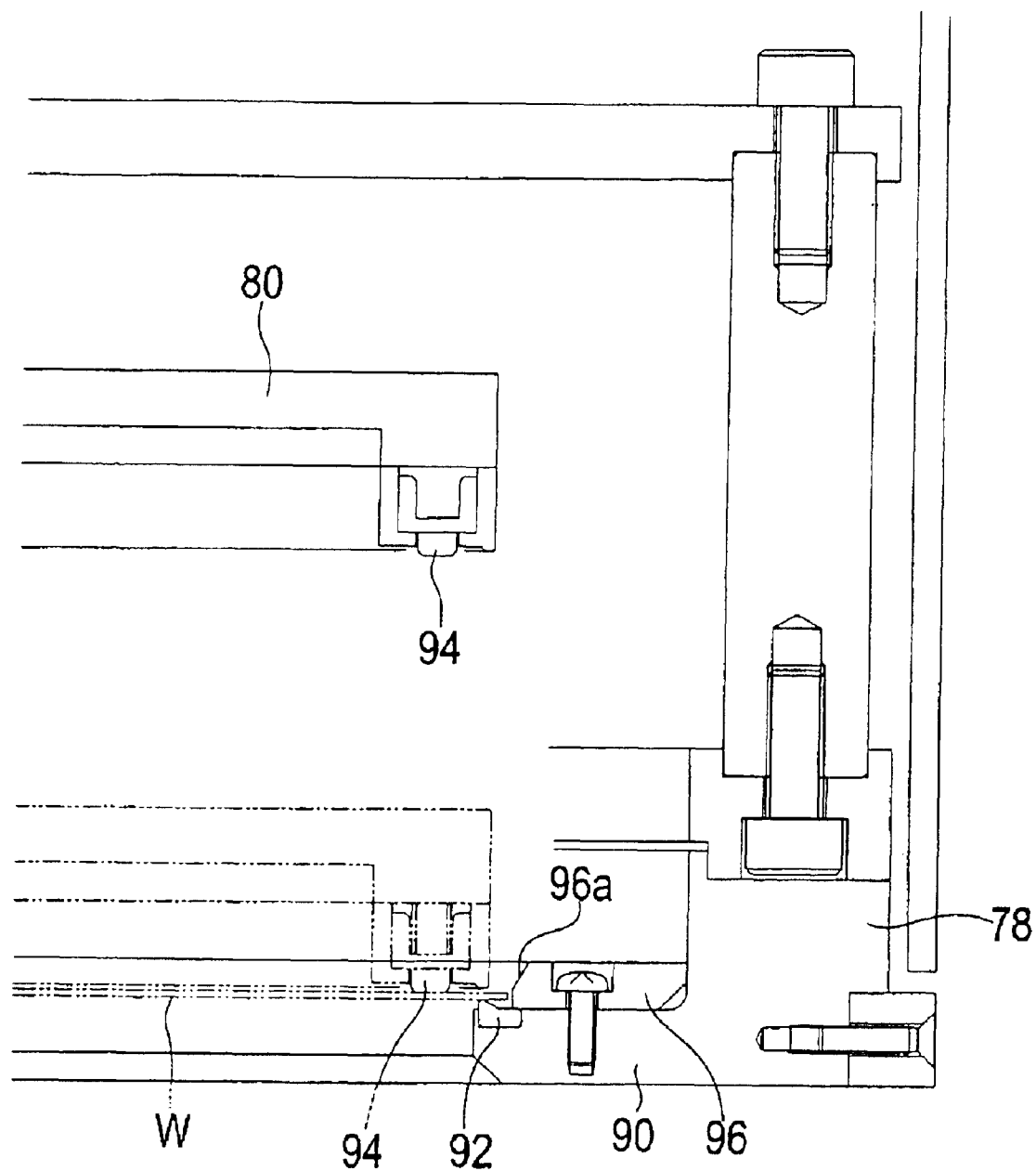
FIG. 8 is an enlarged sectional view of a portion of FIG. 7.

FIGS. 5 and 6 show the second transfer robot 34 provided in the plating treatment area 12. The second transfer robot 34 has, at the end of an extensible robot arm 62 disposed above a robot body 60, a reversing mechanism 66 for rotating a horizontally-extending rotatable shaft 64, to which is connected one hand 68. A thick, back surface-attracting type of hand is used as the hand 68.

The second transfer robot 34 reverses the substrate W so that its front surface faces from upward to downward during its transference from the temporary storage stage 18 to the pre-cleaning unit 26, and reverses the substrate W so that its front surface faces from downward to upward during its transference from the electroless plating treatment unit 32 (or from the inter-plating cleaning unit 36) to the temporary storage stage 18. During the transference of the substrate W between the pre-cleaning unit 26, the first pretreatment unit 28, the second pretreatment unit 30 and the electroless plating treatment unit 32, the second transfer robot 34 transfers the substrate W with its front surface downward. Accordingly, the hand 68 which is of the back surface-attracting type, and which is thick and highly rigid, and thus can avoid an adverse influence on attachment thereto and detachment therefrom of the substrate W, is employed. Further, the provision of the reversing mechanism 66 in the second transfer robot 34 itself avoids the need for separately providing a reversing device and can simplify the apparatus.

The pre-cleaning unit 26, the first pretreatment unit 28 and the second pretreatment unit 30, provided in the plating treatment area 12, utilize an identical treatment unit of the same construction, through different treatment liquids (chemical liquids) are used in the respective units. FIGS. 7 through 12 show a treatment unit 70 as used in the respective units. The treatment unit 70 employs a two-liquid separation system for preventing different liquids from being mixed, and holds the substrate W by sealing a peripheral portion of the lower surface to be treated (front surface), of the substrate W, which has been carried in with the front surface downward, and by pressing the back surface of the substrate W.

The treatment unit 70 includes a vertically-movable body 72, to which is secured a servomotor 74 for rotation of the head, and a substrate holder 78 in the shape of a downwardly-opened, hollow cylinder is connected to the lower end of an output shaft (hollow shaft) 76 that extends downwardly from the servomotor 74. Substrate insertion windows 78a are provided in the circumferential wall portion of the substrate holder 78 for inserting the substrate W into the substrate holder 78. Further, a substrate-pressing member 80 is provided inside the substrate holder 78. The substrate-pressing member 80 is connected to the lower end of vertically-movable rods 88 which in turn are secured to a vertically-movable plate 86 which can move vertically by the actuation of a cylinder 82, fixed to the vertically-movable body 72, for elevation of the substrate-pressing member 80, and can rotate via a bearing 84.

At the lower end of the substrate holder 78 is provided a substrate-holding portion 90 that protrudes inwardly. A seal ring 92, which contacts a peripheral portion of the lower surface of the substrate W, is mounted on an inner portion of the upper surface of the substrate holder 90. Further, a press ring 94, protruding at the lower end, is mounted on a peripheral portion of the substrate-pressing member 80.

In operation, the substrate W is inserted from one of the substrate insertion windows 78a into the substrate holder 78 which is in the elevated position. The substrate W is then guided to a tapered surface 96a provided in the inner circumferential surface of a guide frame 96 and, by positioning, is placed at a predetermined position on the upper surface of the seal ring 92. The substrate-pressing member 80 is then lowered so that the press ring 94 comes into contact with a peripheral portion of the upper surface of the substrate W, and is further lowered so as to press the substrate W downwardly by the elastic force of the press ring 94, thereby bringing the seal ring 92 into pressure contact with a peripheral portion of the front surface (lower surface) of the substrate W. The substrate W is thus held between the seal ring 92 and the press ring 94 with the peripheral portion of the front surface being sealed.

When the servomotor 74 for rotation of the head is actuated while the substrate W is thus held by the substrate holder 78, the output shaft 76 rotates together with the substrate holder 78 and, at the same, the vertically-movable plate 86 also rotates via the bearing 84.

Positioned below the substrate holder 78, there is provided a chemical liquid cup 100 opened upward, and a vertically-movable pure water cup 102 is disposed inside the chemical liquid cup 100 concentrically therewith. Further, a disk-shaped separator 106, having a pleat 104 mounted on its periphery, is provided in such a position that it covers the top opening of the pure water cup 102 when the water cup 102 is lowered. The separator 106 is connected to the upper end of a rotatable shaft 110 that rotates by the rotation of a pulley 108 upon actuation of a motor (not shown).

Figure 9:
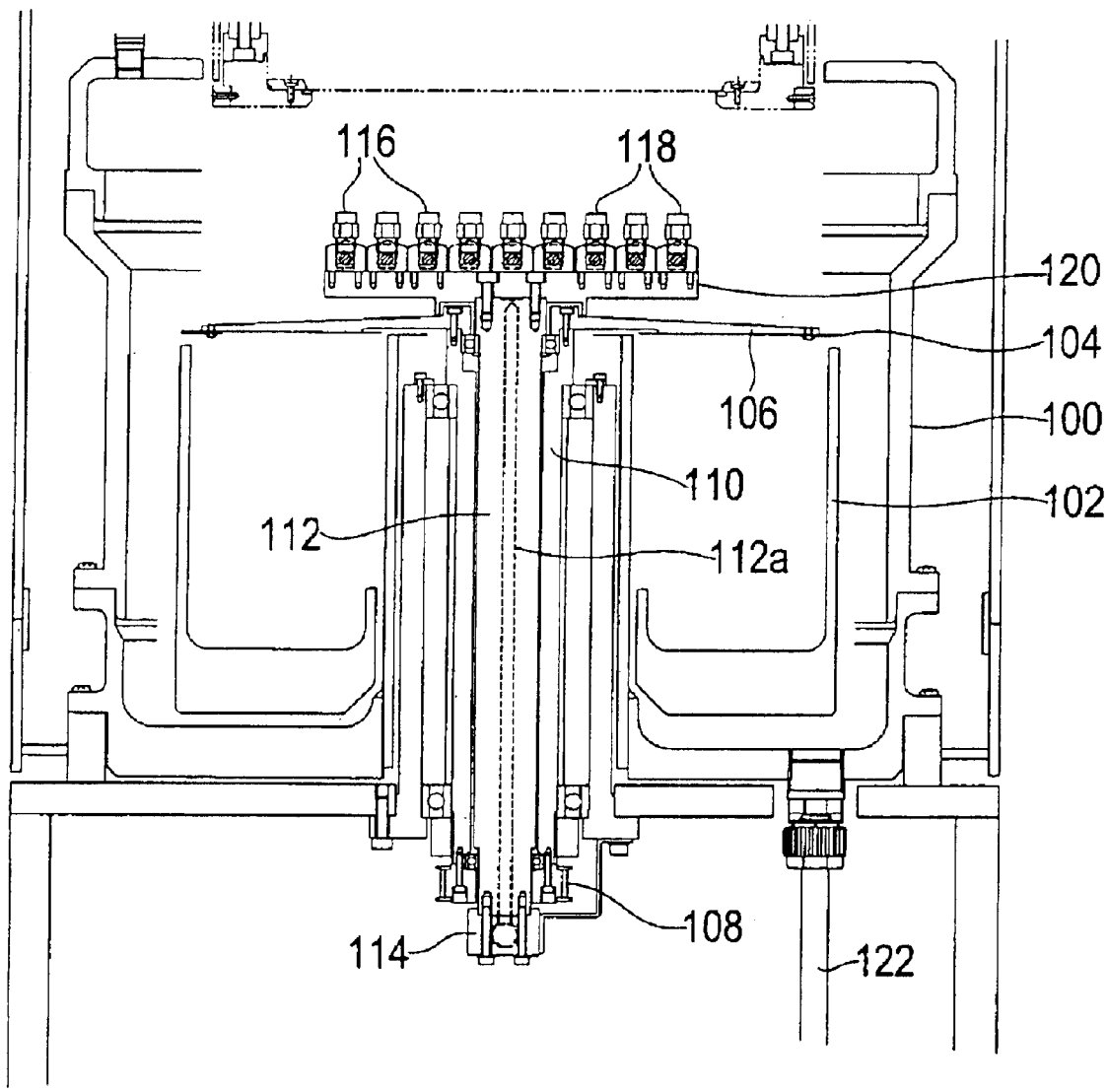
FIG. 9 is a front view showing the lower portion of the treatment unit usable as a pre-cleaning unit or as a pretreatment unit.
Figure 10:
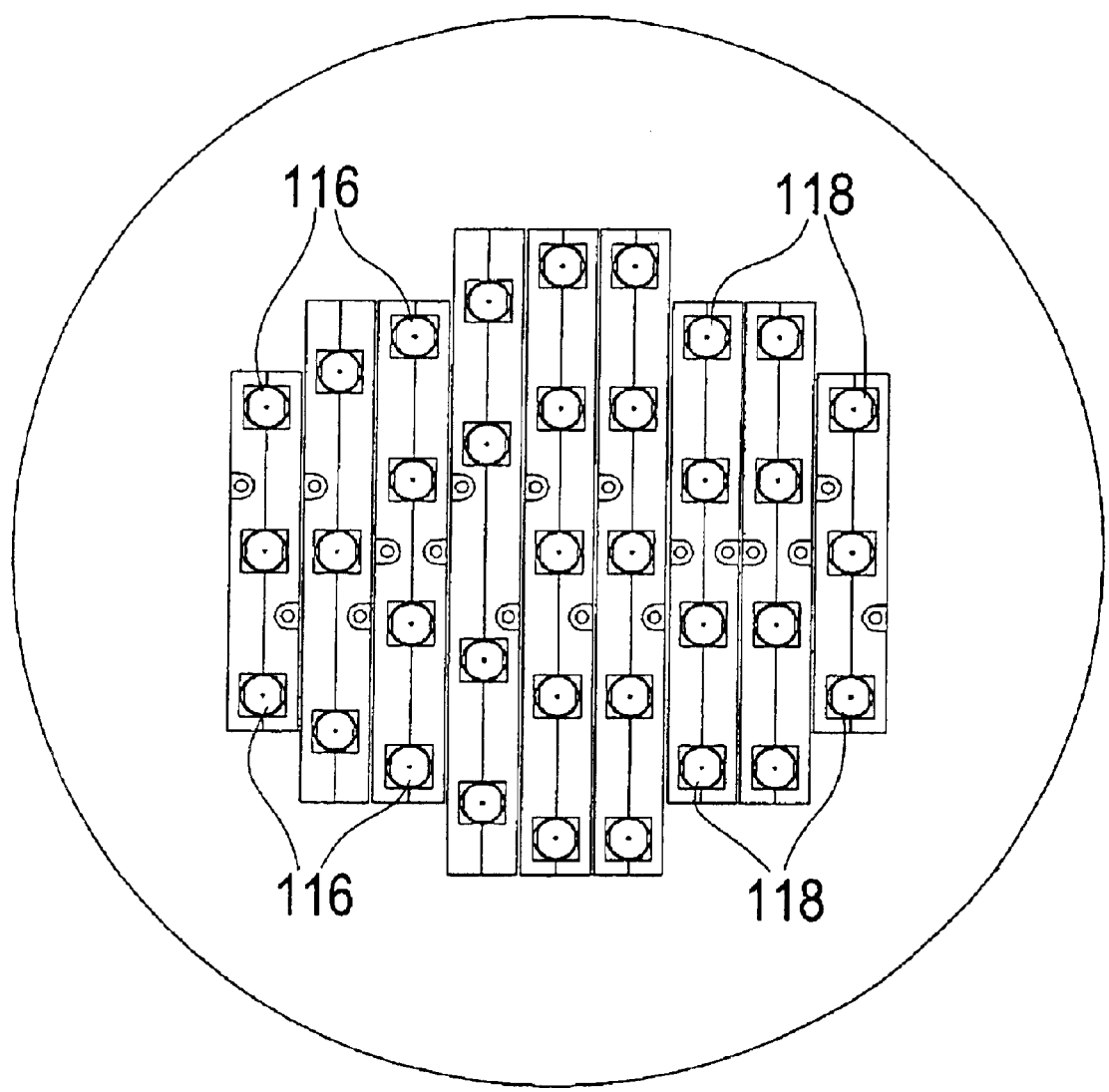
FIG. 10 is a plan view showing chemical liquid spray nozzles and pure water spray nozzles provided in the treatment unit.

In the inside of the rotatable shaft 110, a nozzle shaft 112 is provided which has in its inside two flow slots 112a (only one is shown in FIG. 9) for passing therethrough a chemical liquid and pure water separately and which can rotate by the rotation of a pulley 114 upon actuation of a motor (not shown). To the upper end of the nozzle shaft 112 is connected a nozzle plate 120 on which a plurality of chemical liquid spray nozzles 116 (19 nozzles are shown in FIG. 10) for spraying a chemical liquid and a plurality of pure water spray nozzles 118 (16 nozzles are shown in FIG. 10) for spraying pure water are disposed alternately in lines. Such nozzles can spray a chemical liquid or pure water uniformly toward the substrate W held by the substrate holder 78. A discharge pipe 122 for discharging a chemical liquid (waste liquid) is connected to the bottom of the chemical liquid cup 100.

Figure 11:
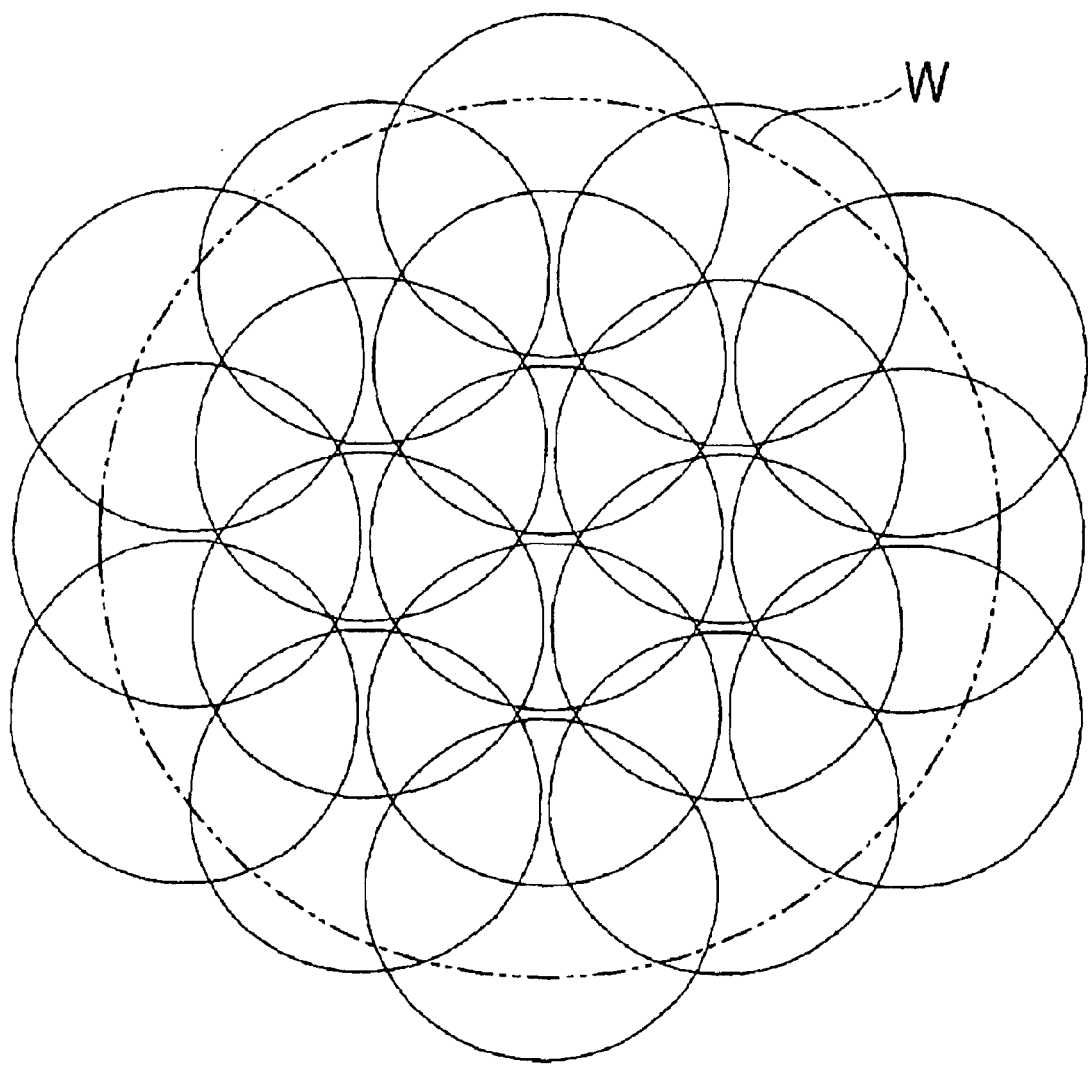
FIG. 11 is a diagram illustrating the spray pattern of a chemical liquid when it is sprayed from the chemical liquid spray nozzles of the treatment unit.
Figure 12:
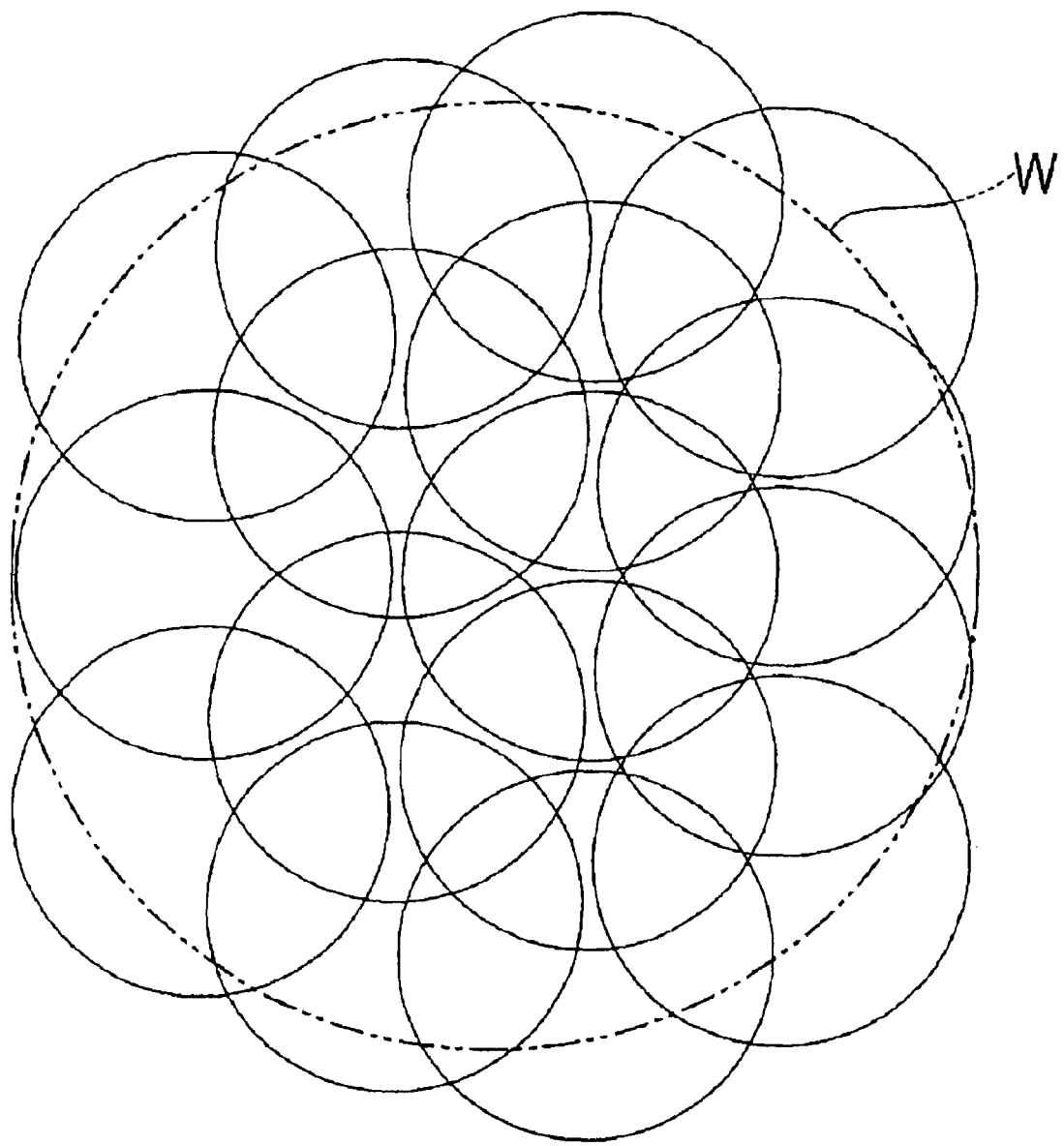
FIG. 12 is a diagram illustrating the spray pattern of pure water when it is sprayed from the pure water spray nozzles of the treatment unit.

FIG. 11 shows the spray pattern upon spraying of a chemical liquid from the chemical liquid spray nozzles 116 toward the substrate W, and FIG. 12 shows the spray pattern upon spraying of pure water from the pure water spray nozzles 118 toward the substrate W.

In operation, the substrate holder 78 holding the substrate W is lowered so that the substrate holder 78 covers the top opening of the chemical liquid cup 100. Further, the pure water cup 102 is lowered so that the separator 106 covers the top opening of the pure water cup 102. While rotating the substrate holder 78, a chemical liquid is sprayed from the chemical liquid spray nozzles 116, disposed on the upper surface of the nozzle plate 120, toward the substrate W whereby the chemical liquid can be sprayed uniformly over the entire lower surface (the surface to be treated) of the substrate W. Further, by rotating the separator 106 simultaneously therewith, the chemical liquid can be discharged through the discharge pipe 122 while preventing the chemical liquid from flowing into the pure water cup 102. Thereafter, the pure water cup 102 is raised so that the pure water cup 102 surrounds the periphery of the substrate W held by the substrate holder 78. While rotating the substrate holder 78, pure water is sprayed from the pure water spray nozzles 118, disposed on the upper surface of the nozzle plate 120, toward the substrate W whereby the pure water can be sprayed uniformly over the entire lower surface of the substrate W and, at the same time, the pure water can be prevented from flowing into the chemical liquid cup 100. The chemical liquid treatment of the substrate W and the cleaning of the substrate with pure water after the chemical liquid treatment can thus be carried out, in the same treatment unit 70, in a continuous manner without mixing of the chemical liquid and pure water.

Thus, the treatment unit 70 includes a first liquid spraying section for spraying a first liquid toward the surface of the substrate held by the substrate holder, which section includes a plurality of the spray nozzles disposed on the nozzle plate below the substrate holder. The pretreatment unit further includes a second liquid spraying section for spraying a second liquid toward the surface of the substrate held by the substrate holder 78, which second liquid spraying section includes a plurality of the spray nozzles disposed on the nozzle plate below the substrate holder 78. Further, the chemical liquid cup 100, pure water cup 103 and separator 106 together form a separation section which prevents the first liquid and the second liquid from being mixed with each other.

An acid solution of e.g. $H_2SO_4$ may be used as the chemical liquid when the treatment unit 70 is used as the pre-cleaning unit 26; a mixed solution, e.g. of $PdCl_2$ and HCl, may be used as the chemical liquid when the unit 70 is used as the first treatment unit 28; and a solution of e.g. sodium citrate may be used as the chemical liquid when the unit 70 is used as the second treatment unit 30. In either case, the chemical liquid treatment is followed by cleaning with pure water, and the cleaned substrate is sent to the next step.

Figure 13:
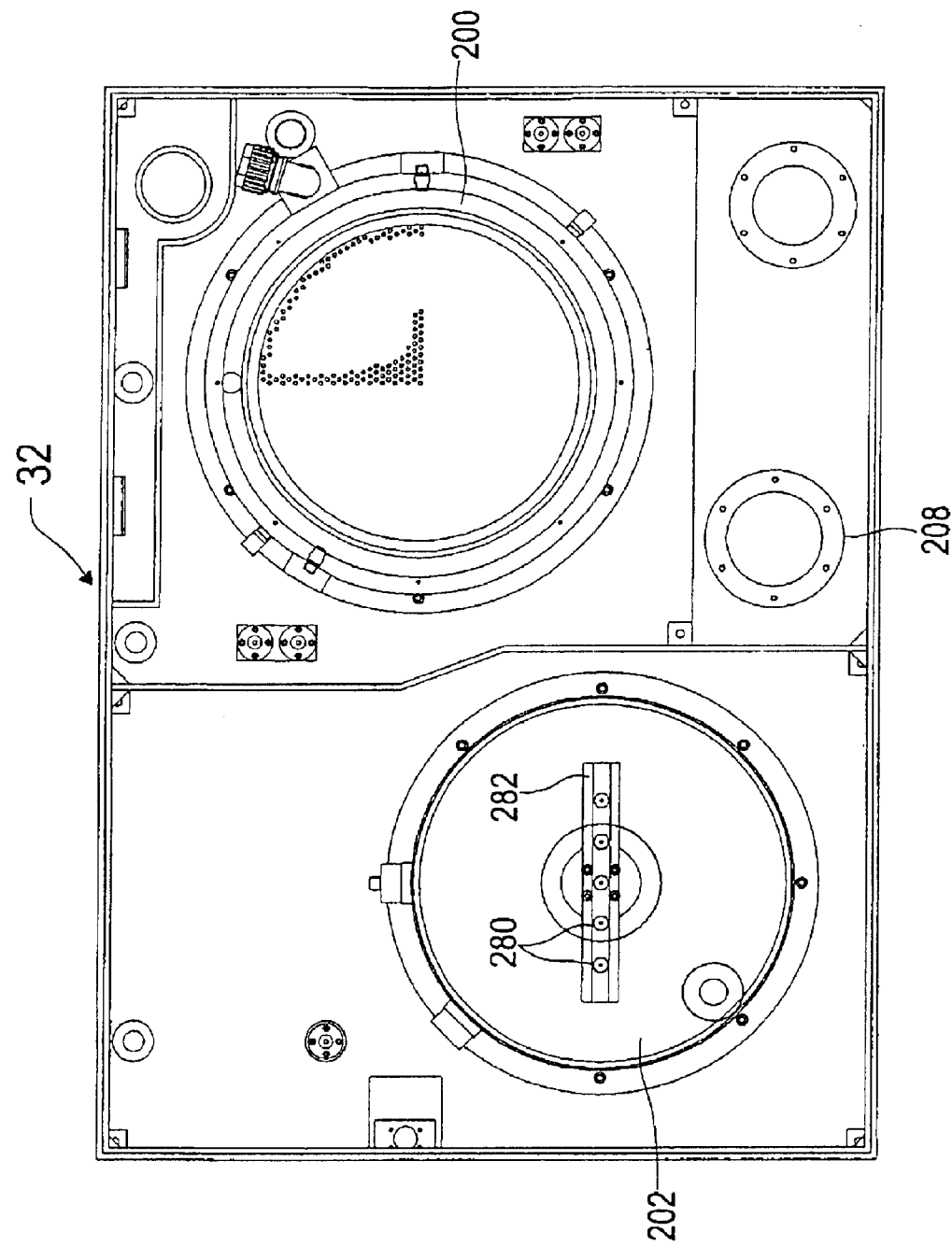
FIG. 13 is a schematic plan view of an electroless plating treatment unit.
Figure 14:
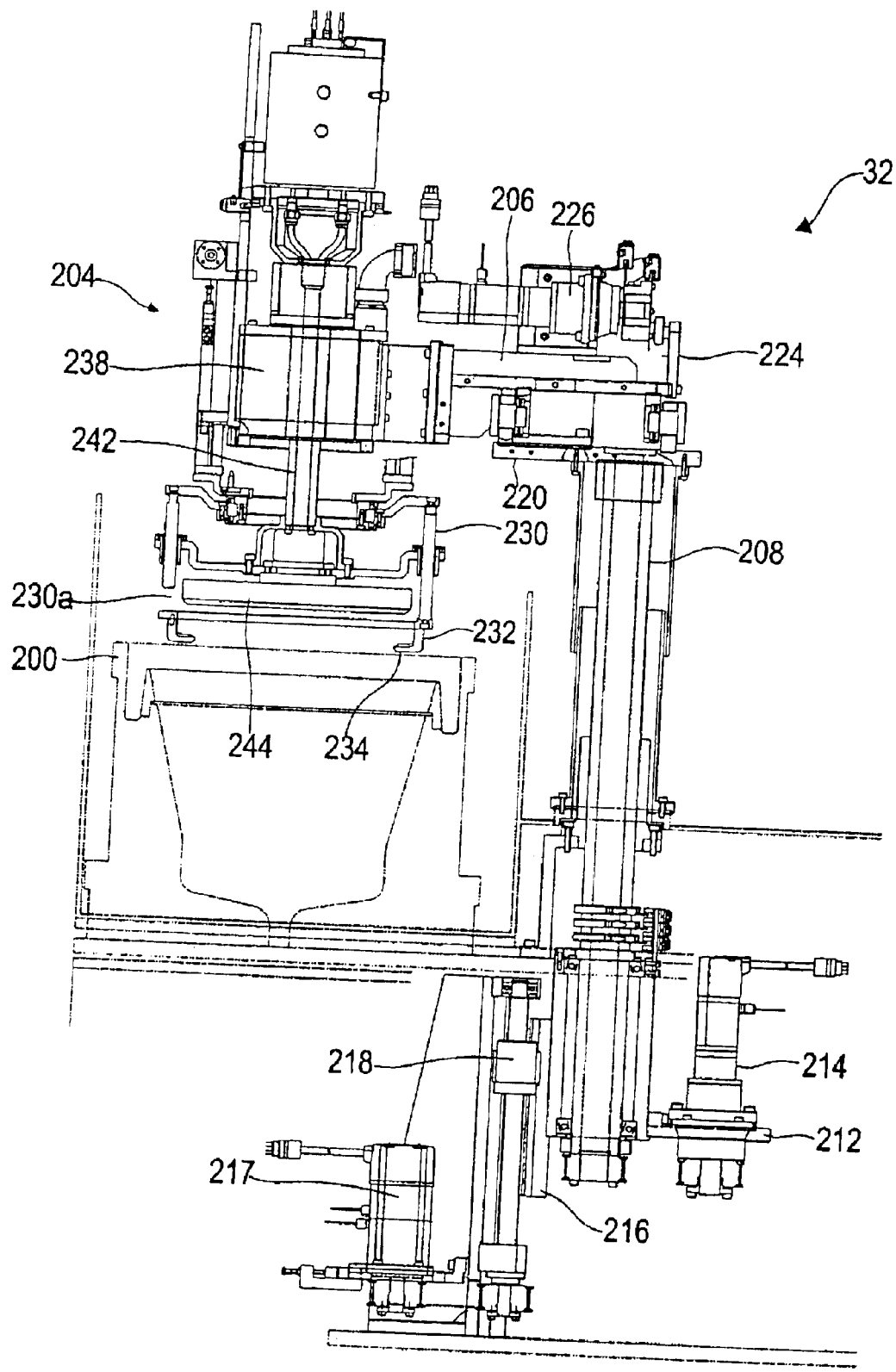
FIG. 14 is a longitudinal sectional front view showing the state of the electroless plating treatment unit when a substrate head is positioned above a plating bath.

FIGS. 13 and 14 show the electroless plating treatment unit 32 provided in the plating treatment area 12. The electroless plating treatment unit 32 comprises a module including two baths, a plating bath 200 and a cleaning bath (rinsing bath) 202, and has a substrate head 204 for holding the substrate W and moving the substrate W between the plating bath 200 and the cleaning bath 202.

The substrate head 204 is connected to the free end of a horizontally-extending tilting shaft 206 which in turn is connected at its base end to the upper end of a vertically-extending pivot shaft 208. The pivot shaft 208 is mounted on a support plate 212, and is allowed to rotate by the actuation of a servomotor 214, secured to the support plate 212, for pivoting of the head. The support plate 212 is connected, via a bracket 216, to ahead-elevating screw 218 that moves vertically by the actuation of a head-elevating motor 217. Thus, the substrate head 204 is allowed to move up and down, together with the pivot shaft 208, and move horizontally (pivot) by the rotation of the pivot shaft 208.

The titling shaft 206 is rotatably mounted on a support 220 which is fixed to the upper end of the pivot shaft 208. A plate link 224 is connected at one end to the end surface of the tilting shaft 206, and is connected at the other end to an output shaft of a servomotor 226, mounted on the support 220, for tilting of the head. Thus, the plate link 224 swings by the rotation of the output shaft of the servomotor 226 for tilting of the head, and, by the swing of the plate link 224, the tilting shaft 206 is allowed to tilt together with the substrate head 204. The tilt angle can be adjusted to any angle by using a mechanical stopper.

The substrate head 204 includes a downwardly-opened, substantially cylindrical housing section 230 and a substrate holder section 232 connected to the lower end of the housing section 230. Substrate insertion windows 230a for carrying in and out the substrate W are provided in the circumferential wall of the housing section 230. A substrate holding portion 234 for holding the substrate W by contacting the periphery of the lower surface of the substrate W is provided at the lower end of the substrate holder section 232. Further, though not illustrated, an attraction head for attracting and holding the substrate W is provided in the substrate holder section 232.

In operation, the substrate W is inserted from one of the substrate insertion windows 230a into the housing section 230, and the substrate W is held temporarily on the substrate holding portion 234. Thereafter, the attraction head is lowered so as to nip a peripheral portion of the substrate W between the substrate holding portion 234 and the attraction head to thereby hold the substrate W. Apart from this, the attraction head alone can attract and hold the substrate W.

The substrate head 204 has a motor 238 for rotation of substrate, and the output shaft (hollow shaft) 242 of the motor 238 is connected to the housing section 230 and to a substrate heater 244 disposed in the housing section 230. Accordingly, the housing section 230 and the substrate heater 244, and also the non-figured attraction head, can rotate together by the actuation of the motor 238 for rotation of substrate.

The plating bath 200 is connected at the bottom to a plating solution supply path, and a plating solution recovery groove is formed in the circumferential wall of the plating bath 200. A plating solution is continuously supplied from the bottom into the plating bath 200, and the plating solution overflowing the plating bath 200 is allowed to flow through the plating solution recovery groove into a plating solution supply tank. The plating solution is thus allowed to circulate. The continuous supply of a plating solution into the plating bath 200 with such circulation, compared to the case of simply using a once-supplied plating solution, can decrease a lowering of the plating solution concentration, whereby the number of treatable substrates W can be increased.

In the bottom of the cleaning bath 202, there are provided a plurality of spray nozzles 280 (four nozzles are shown in FIG. 13) for spraying a rinsing liquid such as pure water upwardly, which are mounted to a bar-like nozzle plate 282. The nozzle plate 282 is connected to the upper end of a nozzle-elevating shaft (not shown).

The cleaning bath 202 is adapted for disposing the substrate W, held in the substrate holder section 232 of the substrate head 204, at a predetermined position and spraying a cleaning liquid (rinsing liquid), such as pure water, from the spray nozzles 280 toward the substrate W, thereby cleaning (rinsing) the substrate W.

In the plating treatment unit 32, the substrate W is held by attraction in the substrate holder section 232 of the substrate head 204, as described above, while the pivot shaft 208 is in the raised position, and a plating solution is kept circulated. At this time, the substrate head 204 is positioned right above the plating bath 200.

When carrying out plating treatment, the servomotor 226 for tilting of the head is actuated to tilt the substrate head 204 by a predetermined angle. While rotating the substrate holder section 232, it is lowered, together with the pivot shaft 208, so that the substrate W held in the substrate holder section 232 is immersed in the plating solution in the plating bath 200. By thus immersing the substrate W, which is in the tilted position, in the plating solution, a gas such as air can be prevented from entering and remaining between the surface (lower surface) of the substrate W and the plating solution. In this regard, if the substrate W, in a horizontal position, is immersed in the plating solution, a gas such as air can remain between the substrate W and the plating solution, leading to uneven plating. Such a drawback can be obviated by tilting the substrate when immersing it in the plating solution.

The substrate W is then returned to a vertical position, according to necessity, and it is kept immersed in the plating solution for a predetermined time. Thereafter, the substrate head 204 is raised so that the substrate W, in a horizontal position or in the tilted position as described above, is pulled out of the plating solution in the plating bath 200. After returning the substrate W to a horizontal position the substrate head 204 is further raised so as to raise the substrate W to the position right above the plating bath 200, and the rotation of the substrate holder section 232 is stopped.

Next, with the substrate W held in the substrate holder section 232 of the substrate head 204, the pivot shaft 208 is rotated to move the substrate head 204 to a position right above the cleaning bath 202. While rotating the substrate holder section 232, it is lowered, together with the pivot shaft 208, to a predetermined position in the cleaning bath 202, where a cleaning liquid (rinsing liquid) such as pure water is sprayed from the spray nozzles 280 to clean (rinse) the substrate W.

After completion of the cleaning of the substrate W, the rotation of the substrate holder section 232 is stopped, and the substrate head 204 is raised so as to raise the substrate W to the position above the cleaning bath 202. The pivot shaft 208 is rotated to move the substrate head 204 to a position for delivery of the substrate, where the substrate W is received by the second transfer robot 34 and sent to the next process step.

According to the plating treatment unit 32, the plating treatment and the subsequent cleaning treatment can be carried out in one module, whereby the time taken for the transition from the plating treatment to the cleaning process can be shortened, and the progress of an extra plating can be avoided.

Figure 15:
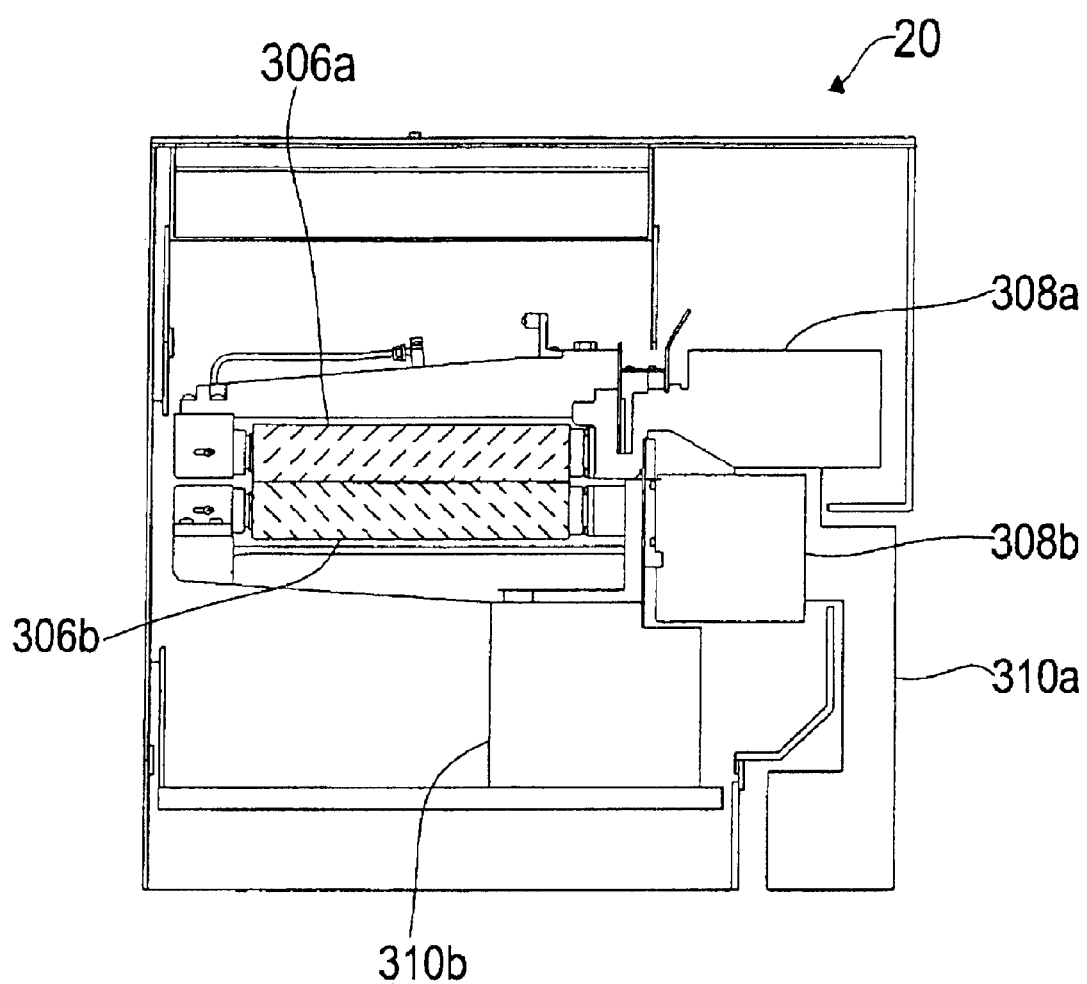
FIG. 15 is a sectional side view of the roll brush cleaning unit.
Figure 16:
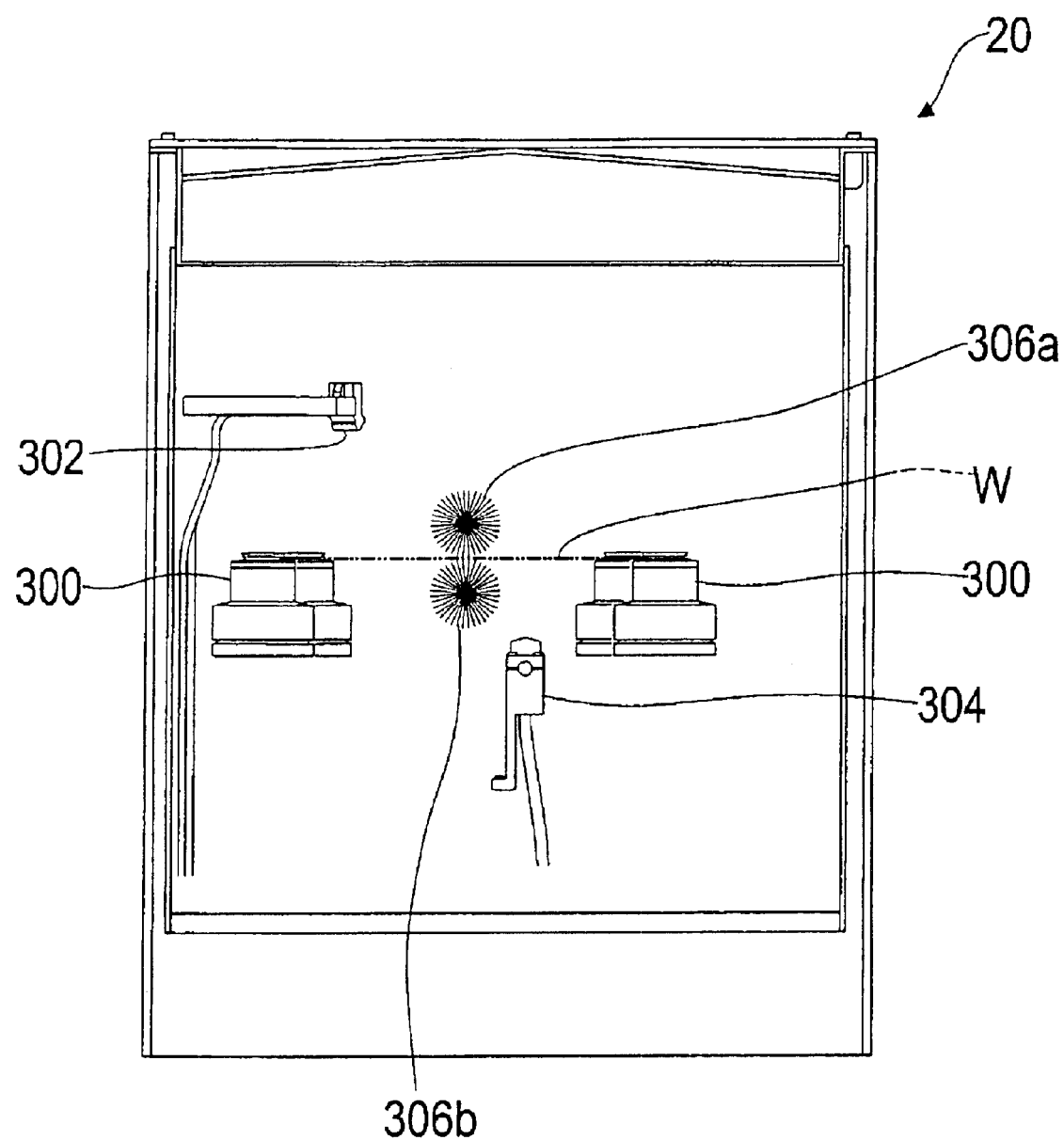
FIG. 16 is a longitudinal sectional front view of a roll brush cleaning unit.
Figure 17:
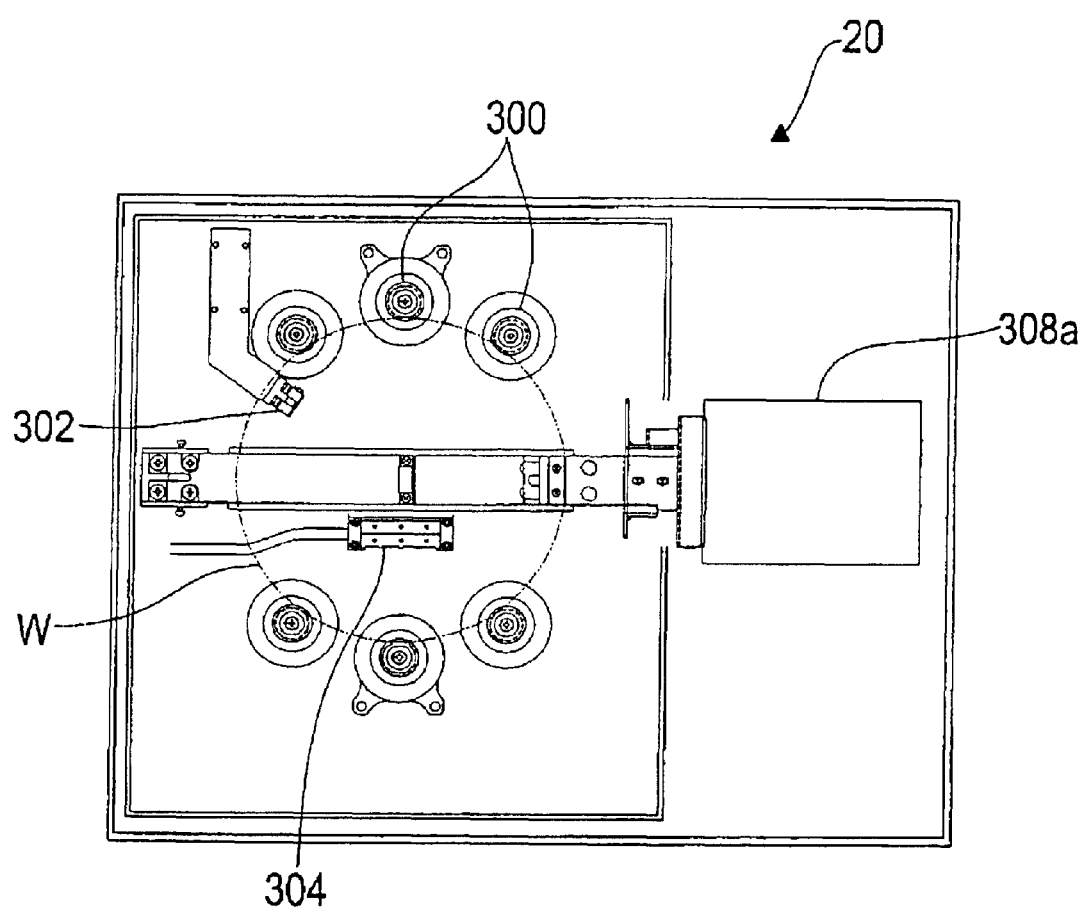
FIG. 17 is a plan view of the roll brush cleaning unit.

A description will now be given below of the roll brush cleaning unit 20 as a cleaning unit. FIG. 15 is a sectional front view of the roll brush cleaning unit 20, FIG. 16 is a sectional side view of the roll brush cleaning unit 20, and FIG. 17 is a plan view of the roll brush cleaning unit 20. The roll brush cleaning unit 20 is a unit for forcibly removing particles and unnecessary substances on the substrate W by a roll-shaped brush, and, as shown in FIGS. 15 through 17, includes a plurality of rollers 300 for nipping a peripheral portion of the substrate W and thereby holding the substrate W, a chemical liquid nozzle 302 for supplying a treatment liquid to the front surface of the substrate W held by the rollers 300, a pure water nozzle 304 for supplying pure water to the back surface of the substrate W, and vertically-movable roll sponges (roll-shaped brushes) 306a, 306b disposed above and below the substrate W.

The rollers 300 are connected to a roller driving motor (not shown), and thus are rotatable. The substrate W held by the rollers 300 is allowed to rotate by the actuation of the roller driving motor. The upper roll sponge 306a is provided to an upper roll rotating unit 308a, and is allowed to rotate by the actuation of a motor (not shown) provided in the upper roll rotating unit 308a. The upper roll rotating unit 308a is mounted on an upper roll elevating unit 310a provided below the upper roll rotating unit 308a, and is allowed to move vertically by the actuation of the upper roll elevating unit 310a. Similarly, the lower roll sponge 306b is provided to a lower roll rotating unit 308b, and is allowed to rotate by the actuation of a motor (not shown) provided in the lower roll rotating unit 308b. The lower roll rotating unit 308b is mounted on a lower roll elevating unit 310b provided below the lower roll rotating unit 308b, and is allowed to move vertically by the actuation of the lower roll elevating unit 310b.

In operation, while holding the substrate W by the rollers 300 and rotating the substrate W by the actuation of the roller driving motor, predetermined treatment liquids are supplied from the chemical liquid nozzle 302 and from the pure water nozzle 304 to the front and back surfaces of the substrate W. At the same time, the substrate W is nipped between the upper roll sponge 306a and the lower roll sponge 306b at an appropriate pressure by the actuation of the roll elevating units 310a, 310b, and the roll sponges 306a, 306b are rotated by the actuation of the respective motors in the roll rotating units 308a, 308b, thereby carrying out cleaning of the substrate W. The roll sponges 306a, 306b may be rotated independently so as to enhance the cleaning effect.

Figure 18:
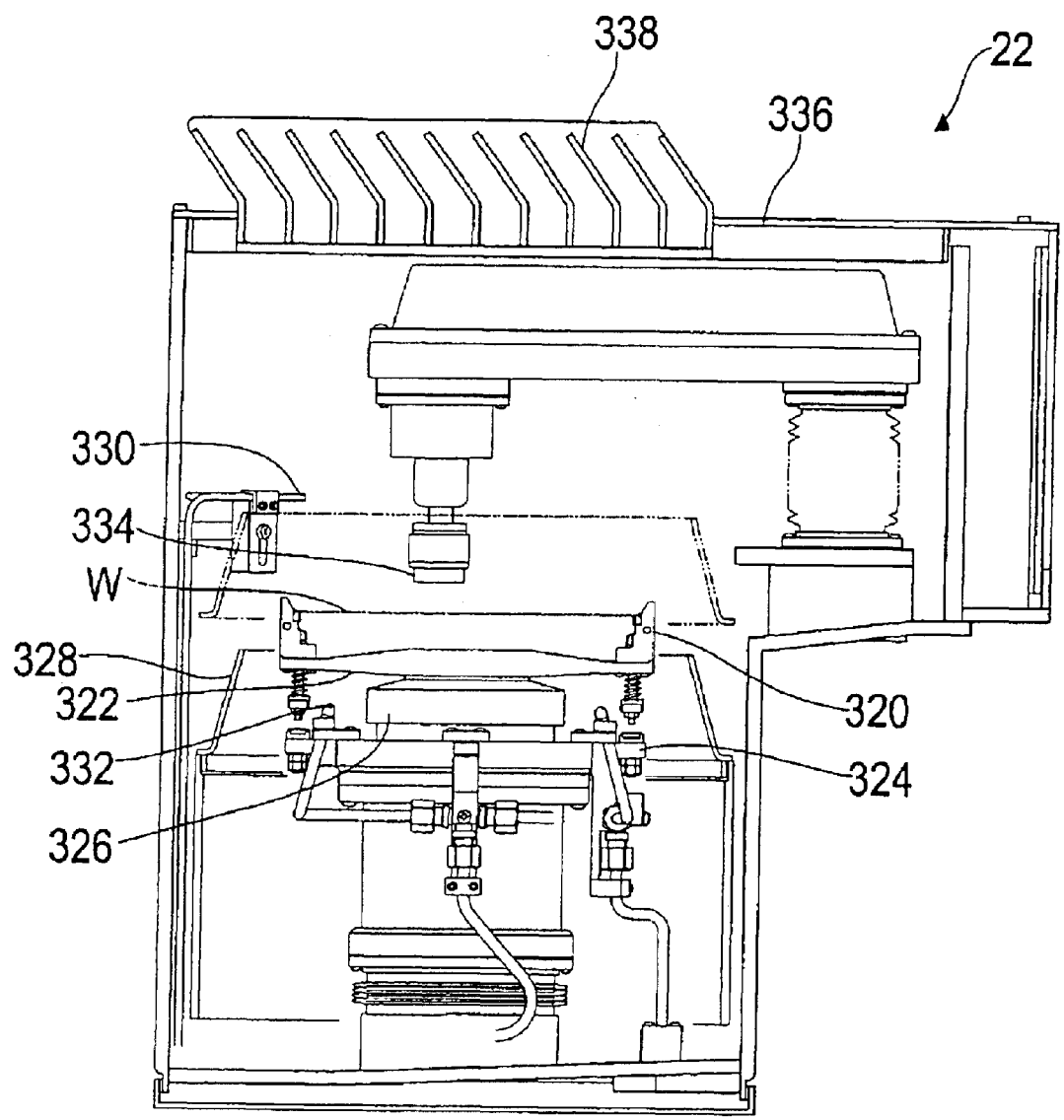
FIG. 18 is a longitudinal sectional front view of a spin-drying unit.
Figure 19:
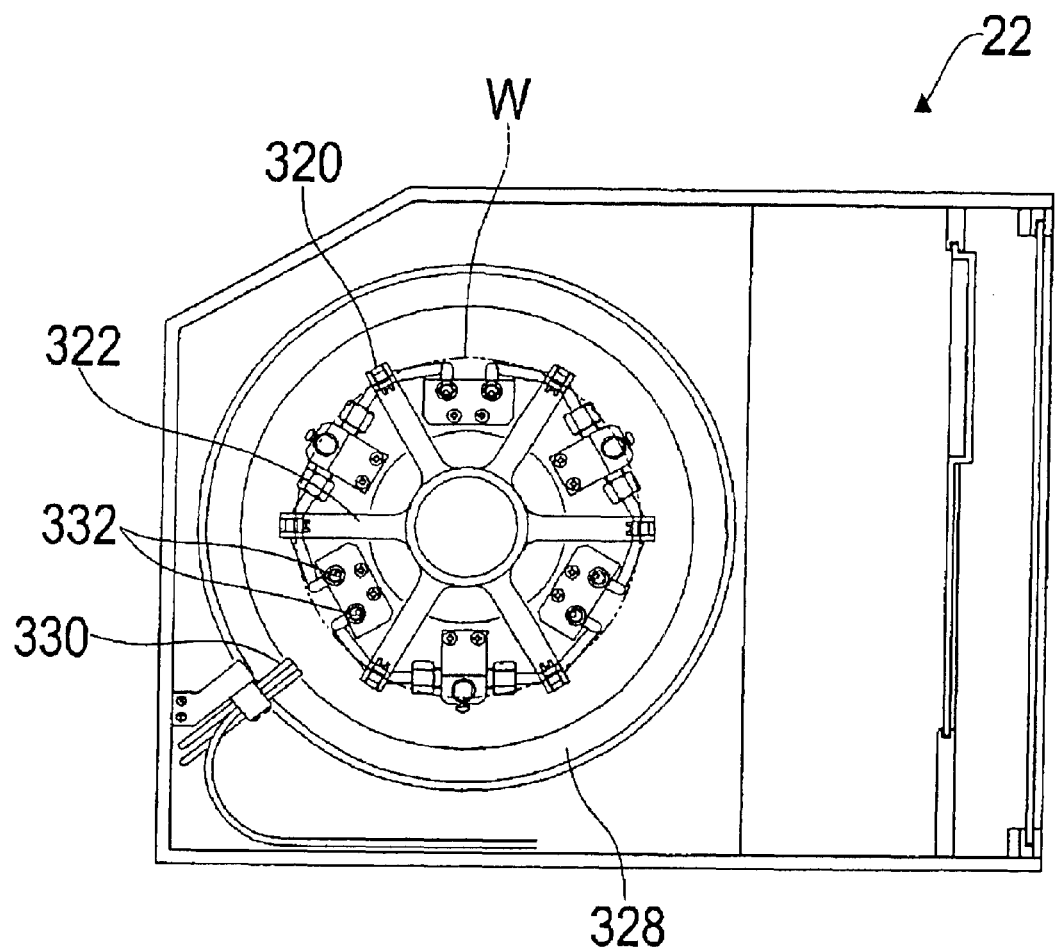
FIG. 19 is a plan view of the spin-drying unit.

A description of the spin-drying unit 22 as a cleaning unit will now be made. FIG. 18 is a sectional front view of the spin-drying unit 22, and FIG. 19 is a plan view of the spin-drying unit 22. The spin-drying unit 22 is a unit for first carrying out chemical cleaning and pure water cleaning of the substrate W, and then drying the cleaned substrate W into a complete dryness by the rotation of a spindle, and, as shown in FIGS. 18 and 19, it includes a substrate stage 322 which is provided with a clamp mechanism 320 for clamping an edge portion of the substrate W, and an elevating plate 324 for attachment and detachment of the substrate, which can open and close the clamp mechanism 320.

The substrate stage 322 is connected to the upper end of a spindle 326 that can rotate at a high speed by the actuation of a spindle rotating motor (not shown). A cleaning cup 328 is disposed around the substrate W clamped by the clamping mechanism 320 for preventing scattering of a treatment liquid. The cleaning cup 328 is allowed to move vertically by the actuation of a cylinder (not shown).

The spin-drying unit 22 also includes a chemical liquid nozzle 330 for supplying a treatment liquid to the front surface of the substrate W clamped by the clamp mechanism 320, a plurality of pure water nozzles 332 for supplying pure water to the back surface of the substrate W, and a rotatable pencil-type cleaning sponge 334 disposed above the substrate W clamped by the clamping mechanism 320. The cleaning sponge 334 is mounted on the free end of a horizontally-swingable pivot arm 336. Further, in the upper portion of the spin-drying unit 22, there is provided a clean air inlet 338 for introducing a clean air into the spin-drying unit 22.

In operation of the thus constructed spin-drying unit 22, while rotating the substrate W clamped by the clamping mechanism 320 and pivoting the pivot arm 336, a treatment liquid is supplied from the chemical liquid nozzle 330 to the cleaning sponge 334 and, at the same time, the cleaning sponge 334 is scrubs the front surface of the substrate W, thereby cleaning the front surface of the substrate W. During the above operation, pure water is supplied from the pure water nozzle 332 to the back surface of the substrate W, whereby the back surface of the substrate W is also cleaned simultaneously. The thus cleaned substrate W is spin-dried by rotating the spindle 326 at a high speed. After the spin-drying, the substrate W is transferred by the second transfer robot 34 to the temporary storage stage 18 and placed on the temporary storage stage 18.

With respect to the electroless plating, there is a case of using a plating solution heated to a high temperature (about 80° C.). In order to do so, an indirect heating system is employed in the present invention in which a plating solution is heated in an indirect manner by using, as a heating medium, hot water which has been heated by means of a separate heater. As compared to an in-line heating system, the above system can prevent impurities being mixed into the very delicate plating solution.

According to the present invention, as described hereinabove, by dividing the interior of the apparatus into two areas, i.e. the loading/unloading and cleaning area, and the plating treatment area, and providing the areas with the first and second transfer robots, respectively, each having a hand or hands meeting the process requirements of the respective area, the process steps for the formation of an interconnects-protective layer e.g. by electroless plating can be carried out consecutively in one apparatus. Accordingly, as compared to the case of carrying out the respective process steps in separate apparatuses, the total facilities can be made compact and a wide installation space is not needed. Further, the initial cost for the apparatus and the running cost can be reduced. In addition, an interconnects-protective film can be formed in a short time.

What is claimed is:

1. A substrate processing apparatus for plating a surface of a substrate, comprising:
   a pretreatment unit for pretreatment of the surface of the substrate;
   a plating unit for plating the substrate after the substrate has been pretreated by said pretreatment unit; and
   a transfer robot for transferring the substrate between said pretreatment unit and said plating unit;
   wherein said pretreatment unit comprises:
      a substrate holder for holding a substrate with the surface of the substrate facing downward,
      a first liquid spraying section for spraying a first liquid toward the surface of the substrate when held by the substrate holder,
      a second liquid spraying section for spraying a second liquid toward the surface of the substrate when held by the substrate holder, and
      a separation section that prevents the first liquid and the second liquid from being mixed when sprayed;
   wherein said separation section comprises:
      a first cup for receiving the first liquid when sprayed;
      a vertically movable second cup having an opening that opens upwardly and is disposed inside said first cup for receiving the second liquid when sprayed; and
      a separator that covers said opening of said second cup when the first liquid is sprayed toward the surface of the substrate.

2. The substrate processing apparatus of claim 1, wherein said separator covers said opening of said second cup when said second cup is in a lowered position.

3. The substrate processing apparatus of claim 1, wherein said separator covers said opening of said second cup in the lowered position to prevent the first liquid from flowing into said second cup.

4. The substrate processing apparatus of claim 1, wherein said separator is connected to an upper end of a rotatable shaft.

5. The substrate processing apparatus of claim 1, wherein said separator has a pleat mounted on its periphery.

6. A substrate processing apparatus for plating a surface of a substrate, comprising:
   a pretreatment unit for pretreatment of the surface of the substrate;
   a plating unit for plating the substrate after the substrate has been pretreated by said pretreatment unit; and
   a transfer robot for transferring the substrate between said pretreatment unit and said plating unit;
   wherein said pretreatment unit comprises:
      a substrate holder for holding a substrate with the surface of the substrate facing downward,
      first liquid spraying nozzles for spraying a first liquid toward the surface of the substrate when held by the substrate holder, second liquid spraying nozzles for spraying a second liquid toward the surface of the substrate when held by the substrate holder, and a separator that prevents the first liquid and the second liquid from being mixed when sprayed;

wherein a first cup is positioned to receive the first liquid when sprayed, a vertically movable second cup has an opening that opens upwardly and is disposed inside said first cup to receive the second liquid when sprayed and said separator covers said opening of said second cup when the first liquid is sprayed toward the surface of the substrate.

7. The substrate processing apparatus of claim 6, wherein said separator covers said opening of said second cup in the lowered position to prevent the first liquid from flowing into said second cup.

8. The substrate processing apparatus of claim 6, wherein said separator is connected to an upper end of a rotatable shaft.

9. The substrate processing apparatus of claim 6, wherein said separator has a pleat mounted on its periphery.

10. The substrate processing apparatus of claim 6, wherein said separator covers said opening of said second cup when said second cup is in a lowered position.

11. A substrate processing apparatus for plating a surface of a substrate, comprising:

a pretreatment unit for pretreatment of the surface of the substrate;

a plating unit for plating the substrate after the substrate has been pretreated by said pretreatment unit; and a transfer robot for transferring the substrate between said pretreatment unit and said plating unit;

wherein said pretreatment unit comprises:

a substrate holder for holding a substrate with the surface of the substrate facing downward, first liquid spraying nozzles for spraying a first liquid toward the surface of the substrate when held by the substrate holder, second liquid spraying nozzles for spraying a second liquid toward the surface of the substrate when held by the substrate holder, and a separator that prevents the first liquid and the second liquid from being mixed when sprayed;

wherein said first and second liquid spraying nozzles are disposed on a common nozzle plate below said substrate holder.

* * * * *